United States Patent
Isobe et al.

(10) Patent No.: US 9,184,406 B2
(45) Date of Patent: Nov. 10, 2015

(54) METHOD OF MANUFACTURING AN ORGANIC LIGHT-EMITTING ELEMENT, ORGANIC LIGHT-EMITTING ELEMENT, DISPLAY PANEL, AND DISPLAY DEVICE

(71) Applicant: JOLED INC., Tokyo (JP)

(72) Inventors: Takashi Isobe, Nara (JP); Kosuke Mishima, Kyoto (JP); Kaori Akamatsu, Osaka (JP); Satoru Ohuchi, Osaka (JP)

(73) Assignee: JOLED INC., Tokyo (JP)

( * ) Notice: Subject to any disclaimer, the term of this patent is extended or adjusted under 35 U.S.C. 154(b) by 0 days.

(21) Appl. No.: 14/260,711

(22) Filed: Apr. 24, 2014

(65) Prior Publication Data
US 2014/0231777 A1   Aug. 21, 2014

Related U.S. Application Data

(60) Division of application No. 13/361,280, filed on Jan. 30, 2012, now Pat. No. 8,816,363, which is a continuation of application No. PCT/JP2010/006959, filed on Nov. 29, 2010.

(51) Int. Cl.
*H01L 51/56* (2006.01)
*H01L 51/50* (2006.01)
*H01L 27/32* (2006.01)

(52) U.S. Cl.
CPC ........ *H01L 51/5056* (2013.01); *H01L 51/5072* (2013.01); *H01L 51/5088* (2013.01); *H01L 51/56* (2013.01); *H01L 27/3246* (2013.01); *H01L 2251/562* (2013.01)

(58) Field of Classification Search
CPC ............ H01L 27/3246; H01L 51/5088; H01L 2251/562
USPC ............. 313/504; 257/40, E51.022, E51.027, 257/E51.018; 438/29; 427/66, 331
See application file for complete search history.

(56) References Cited

U.S. PATENT DOCUMENTS 5,443,922 A   8/1995   Nishizaki et al.
7,785,718 B2   8/2010   Yatsunami et al.
(Continued)

FOREIGN PATENT DOCUMENTS

CN   101800290   8/2010
JP   5-163488   6/1993
(Continued)

OTHER PUBLICATIONS

United States Office Action in U.S. Appl. No. 13/361,280, dated Jun. 13, 2013.
United States Office Action in U.S. Appl. No. 13/361,280, dated Dec. 24, 2013.
International Search Report in PCT/JP2010/006959, dated Mar. 1, 2011.
(Continued)

*Primary Examiner* — Ken Parker
*Assistant Examiner* — Bo Fan
(74) *Attorney, Agent, or Firm* — Greenblum & Bernstein, P.L.C.

(57) ABSTRACT

A method of manufacturing an organic light-emitting element is provided. A first layer is formed above a substrate, and exhibits hole injection properties. A bank material layer is formed above the first layer using a bank material. Banks are formed by patterning the bank material layer, and forming a resin film on a surface of the first layer by attaching a portion of the bank material layer to the first layer. The banks define apertures corresponding to light-emitters. The resin material is the same as the bank material. A functional layer is formed by applying ink to the apertures that contacts the resin film. The ink contains an organic material. The functional layer includes an organic light-emitting layer. A second layer is formed above the functional layer and exhibits electron injection properties. The hole injection properties of the first layer are degraded by applying electrical power to an element structure.

20 Claims, 30 Drawing Sheets

(56) References Cited

U.S. PATENT DOCUMENTS

| | | |
|---|---|---|
| 7,993,960 B2 | 8/2011 | Mathea et al. |
| 2005/0106419 A1 | 5/2005 | Endoh et al. |
| 2005/0170208 A1 | 8/2005 | Yatsunami et al. |
| 2008/0143251 A1 | 6/2008 | Mathea et al. |
| 2008/0143252 A1 | 6/2008 | Lee et al. |
| 2008/0227357 A1 | 9/2008 | Liu |
| 2009/0160325 A1 | 6/2009 | Yatsunami et al. |
| 2009/0200917 A1 | 8/2009 | Yamagata et al. |
| 2009/0250685 A1* | 10/2009 | Moon .............................. 257/13 |
| 2010/0019232 A1 | 1/2010 | Lee et al. |
| 2010/0051941 A1 | 3/2010 | Tanaka |
| 2010/0102310 A1 | 4/2010 | Komatsu et al. |
| 2010/0181559 A1* | 7/2010 | Nakatani et al. ................ 257/40 |
| 2011/0260183 A1 | 10/2011 | Mathea et al. |
| 2011/0291085 A1 | 12/2011 | Kondoh et al. |
| 2012/0061656 A1 | 3/2012 | Ohuchi et al. |

FOREIGN PATENT DOCUMENTS

| | | |
|---|---|---|
| JP | 2000-156291 | 6/2000 |
| JP | 2005-203339 | 7/2005 |
| JP | 2007-128663 | 5/2007 |
| JP | 2008-160108 | 7/2008 |
| JP | 2010-103105 | 5/2010 |
| JP | 2010-103374 | 5/2010 |
| JP | 2010103105 A * | 5/2010 |
| WO | 2010/092798 | 8/2010 |

OTHER PUBLICATIONS

U.S. Appl. No. 13/361,006 to Keiko Kurata et al., which was filed Jan. 30, 2012.

Hiromi Watanabe et al., "Structure and Physical Property Evaluation of $MoO_x$ Thin-Film in Reactive Sputtering Method, and $MoO_x$/α-NPD Boundary Analysis," (Nov. 20, 2008). (Along with a certified English language partial translation).

Hyunbok Lee et al., "The origin of the hole injection improvements at indium tin oxide/molybdenum trioxide/N,N'-bis (1-naphthyl)-N,N'-diphenyl-1,1'-biphenyl-4,4'-diamine interface", Applied Physics Letters-Ameerican Institute of Physics, vol. 93, 043308 (2008).

Kaname Kanai et al., "Electronic structure of anode interface with molybdenum oxide buffer layer", Organic Electronics 11, pp. 188-194 (2010).

Yasuo Nakayama et al., "MoO3 on F8BT Boundary Electron Structure: Research through Photoemission Spectrography and Meta-Stable Excited Atom Spectrometry," (Nov. 20, 2008). (Along with a certified English language partial translation).

United States Office Action in U.S. Appl. No. 13/621,280, dated Jun. 13, 2013.

United States Office Action in U.S. Appl. No. 13/621,280, dated Dec. 24, 2013.

China Office Action from State Intellectual Property Office (SIPO) in Chinese Patent Application No. 2010800260668, dated May 6, 2015, together with a partial English language translation.

* cited by examiner

FIG. 6
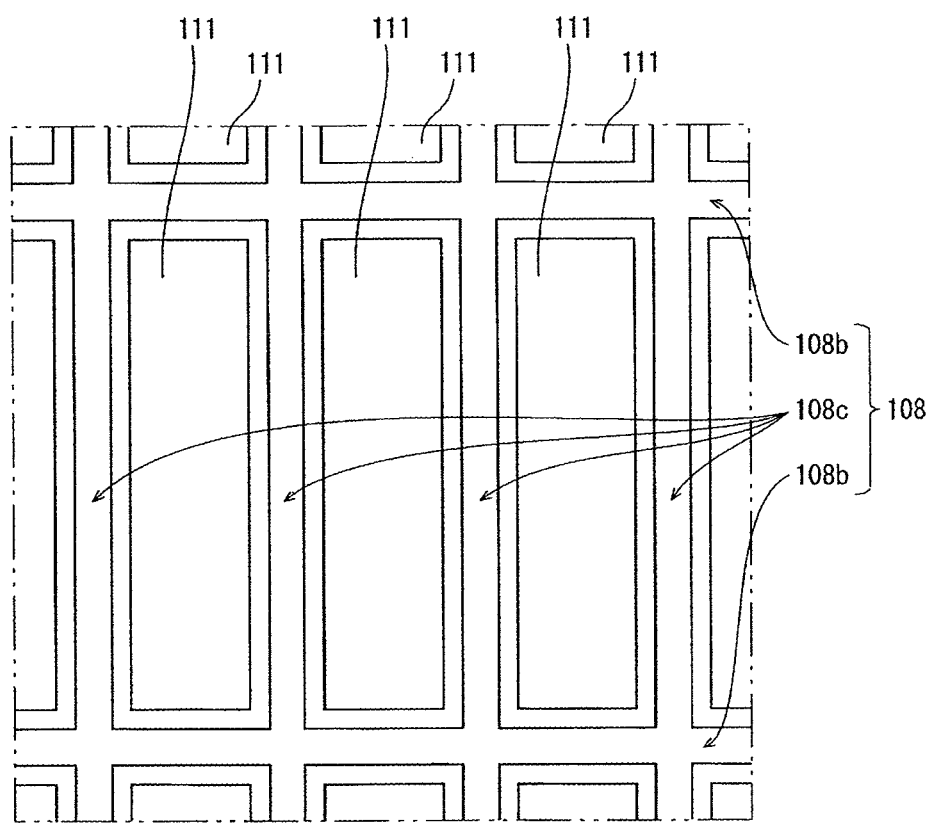
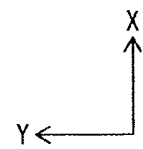

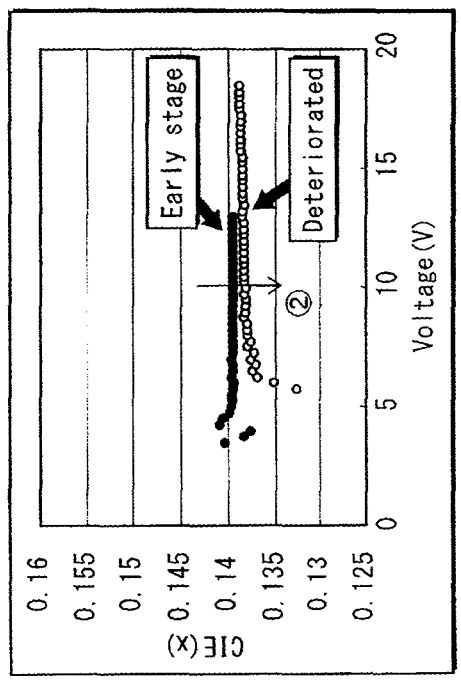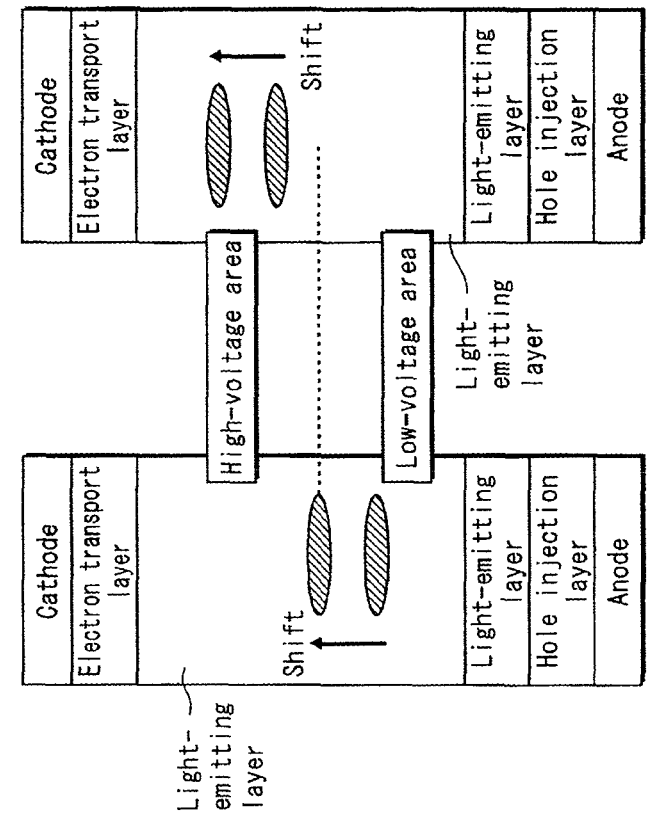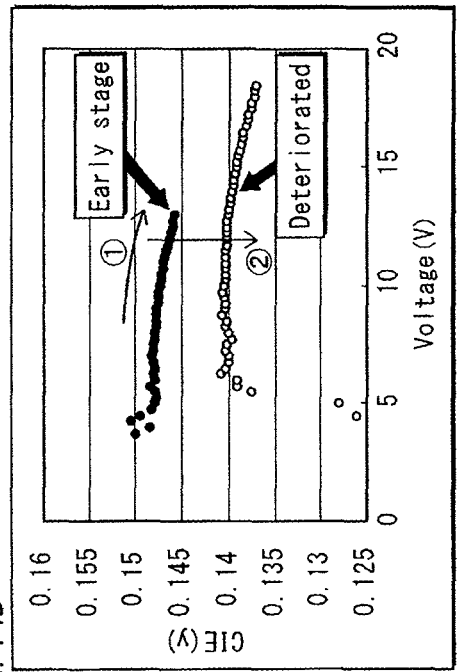

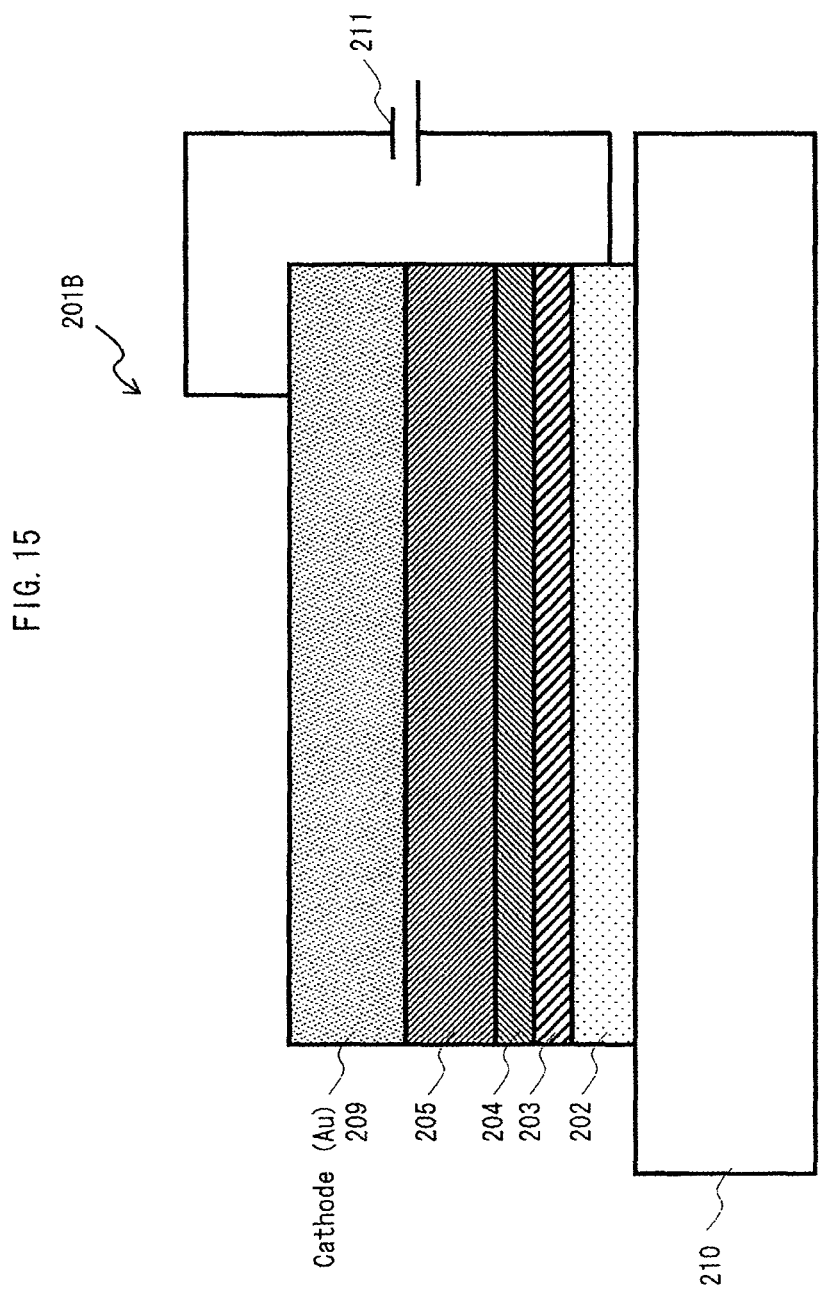

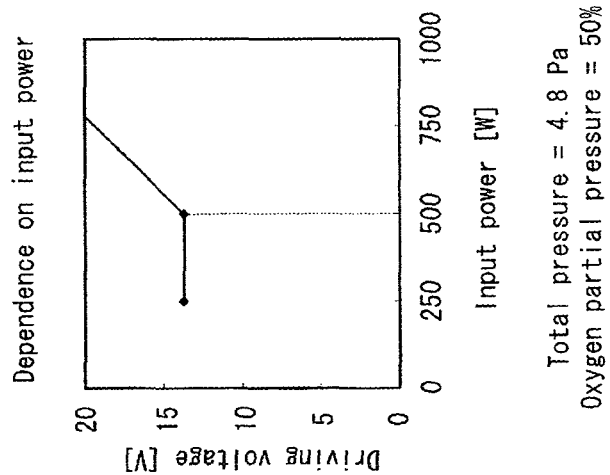
FIG. 16C Dependence on input power
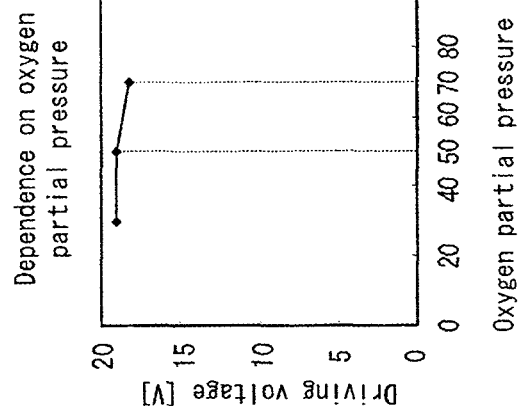
FIG. 16B Dependence on oxygen partial pressure
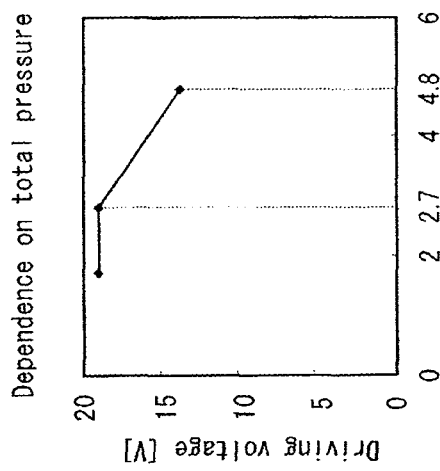
FIG. 16A Dependence on total pressure 201A (sample device for photoelectron spectroscopy)

208
207

(A: a case where an appropriate number of injection sites exists in the tungsten oxide layer)

(B, C: a case where there are no injection sites in the tungsten oxide layer and a case where there is a shortage of injection sites in the tungsten oxide layer)

FIG. 29
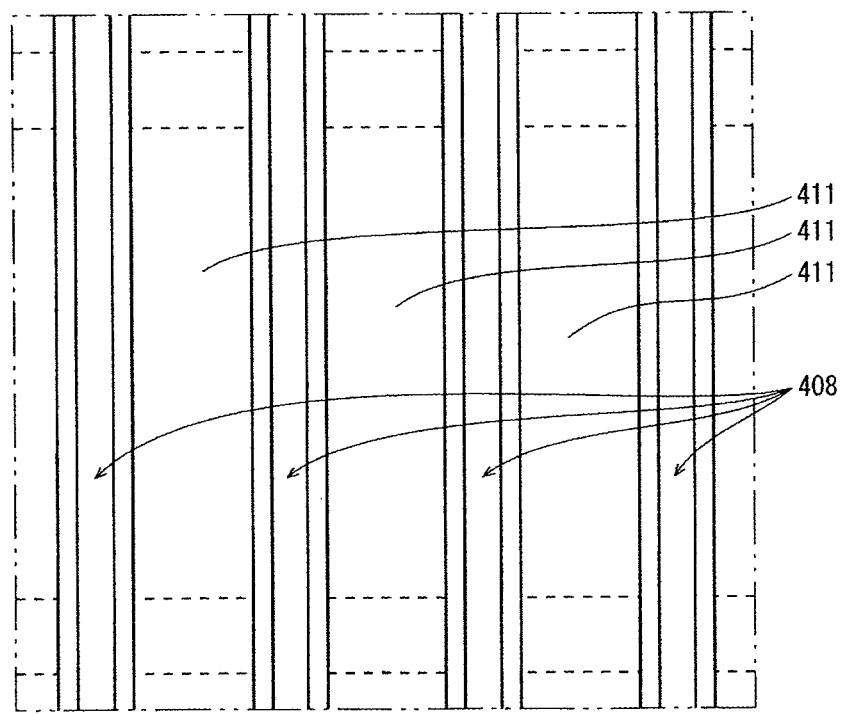
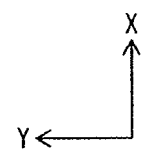

METHOD OF MANUFACTURING AN ORGANIC LIGHT-EMITTING ELEMENT, ORGANIC LIGHT-EMITTING ELEMENT, DISPLAY PANEL, AND DISPLAY DEVICE

CROSS-REFERENCE TO RELATED APPLICATIONS

This is a divisional application of U.S. application Ser. No. 13/361,280, filed Jan. 30, 2012, which is a continuation application of PCT Application No. PCT/JP2010/006959 filed on Nov. 29, 2010, designating the United States of America. The disclosures of these documents, including the specifications, drawings, and claims, are incorporated herein by reference in their entireties.

TECHNICAL FIELD

The present invention relates to a method of manufacturing an organic light-emitting element, an organic light-emitting element, a light-emitting device, a display panel, and a display device.

BACKGROUND ART

Organic light-emitting elements, which have been researched and developed in recent years, are light-emitting elements that utilize light-emitting phenomenon of a solid fluorescent substance (For example, see Patent Literature 1). Organic light-emitting elements are manufactured by the following steps.

First, a reflective anode, which is a metal film, is formed on a substrate with an interlayer insulation film therebetween. Next, banks made of insulating material are formed to surround the edges of the reflective anode. Then, a hole injection layer and a light-emitting layer, which are organic films, are formed in the apertures defined by the banks. Here, as a constituent material of the hole injection layer, conductive polymer such as PEDOT/PSS (a mixture of polythiophene and polystyrene sulfonic acid) has conventionally been used.

Next, a cathode, which is a transparent conductive film, is formed on the light-emitting layer, and thus an organic light-emitting element is formed.

CITATION LIST

Patent Literature

[Patent Literature 1] Japanese Patent Application Publication No. 2005-203339

SUMMARY OF INVENTION

Technical Problem

However, conventional organic light-emitting elements mentioned above have a problem that the luminous efficiency is degraded after they are driven for a long time. Furthermore, there is a demand for reduction of the manufacturing cost of organic light-emitting elements.

The present invention is made in view of the problems above, and an aim of the present invention is to provide a method of manufacturing an organic light-emitting element, an organic light-emitting element, a light-emitting device, a display panel and a display device which achieve high luminous efficiency regardless of the length of the driving time, while suppressing the increase in the manufacturing cost.

Solution to Problem

A method of manufacturing an organic light-emitting element pertaining to one aspect of the present invention is characterized by the following steps:

First step: Forming a first layer above a substrate, the first layer exhibiting hole injection properties.

Second step: Forming a bank material layer above the first layer by using bank material.

Third Step: Forming banks by patterning the bank material layer, while forming a resin film on a surface of the first layer by attaching a portion of the bank material layer to the first layer, the banks defining apertures corresponding to light-emitters.

Fourth step: Forming a functional layer by applying ink to the apertures such that the ink has contact with the resin film, the ink containing organic material, and the functional layer including an organic light-emitting layer.

Fifth step: Forming a second layer above the functional layer, the second layer exhibiting electron injection properties.

Sixth step: Degrading the hole injection properties of the first layer by applying power to an element structure formed by performing the first to the fifth step.

Advantageous Effects of Invention

According to a manufacturing method of the organic light-emitting element pertaining to one aspect of the present invention, a functional layer containing an organic light-emitting layer is formed to be in contact with the resin film formed on the surface of the first layer, and the hole injection properties are degraded by the power application performed in the sixth step. As a result, the balance between the hole injection properties and the electron injection properties in an organic light-emitting element manufactured by the manufacturing method pertaining to one aspect of the present invention is maintained even after the passage of a long driving time. Hence, an organic light-emitting element manufactured by the manufacturing method pertaining to one aspect of the present invention achieves a high luminous efficiency regardless of the length of the driving time Furthermore, in the third step of the manufacturing method pertaining to one aspect of the present invention, the resin film is formed by using a portion of the bank material layer, and it is therefore unnecessary to add a new step for forming the resin film. This suppresses the increase in the manufacturing cost.

Therefore, according to the method of manufacturing an organic light-emitting element pertaining to one aspect of the present invention, it is possible to manufacture organic light-emitting elements which achieve a high luminous efficiency regardless of the length of the driving time, while suppressing the increase in the manufacturing cost.

BRIEF DESCRIPTION OF DRAWINGS

FIG. 6 is a schematic plan view showing the structure of a bank 108 in a display panel 10.

FIGS. 14A and 14B are characteristics charts showing CIE values in an element structure at an early stage of driving and in an element structure after being deteriorated, and FIGS. 14C and 14D are schematic cross-sectional views showing a light-emitting point in an element structure at an early stage of driving and in an element structure after being deteriorated.

FIG. 15 is a schematic cross-sectional view showing the structure of a hole-only element.

FIGS. 16A-16C are graphs showing dependencies of a driving voltage of a hole-only element upon a condition under which the hole injection layer is formed.

FIG. 29 is a schematic plan view showing the structure of a bank 408 in a display panel pertaining to Embodiment 3 of the present invention.

DESCRIPTION OF EMBODIMENTS

[Aspects of Present Invention]

Figure 1:
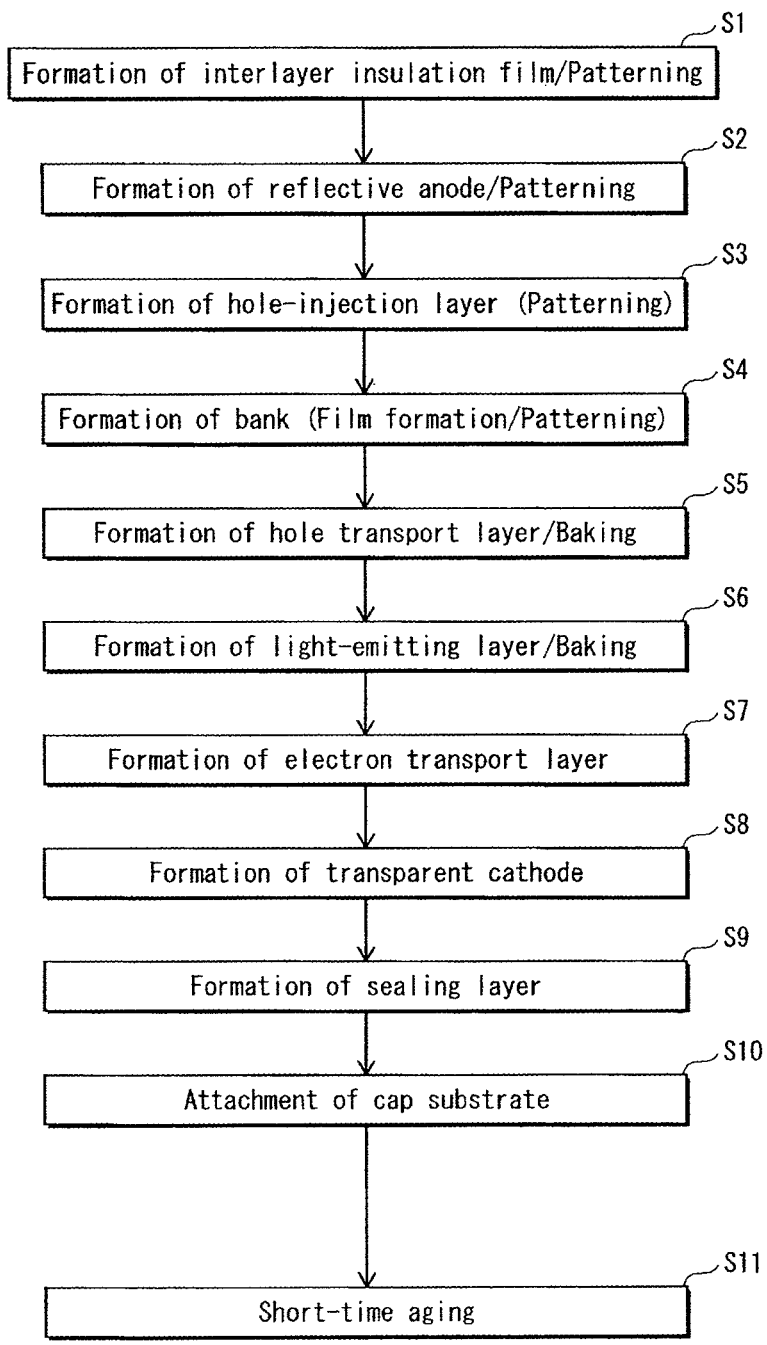
FIG. 1 is a schematic process chart showing steps of manufacturing a display device a pertaining to Embodiment 1 of the present invention.

A method of manufacturing an organic light-emitting element pertaining to one aspect of the present invention is characterized by the following steps:

First step: Forming a first layer above a substrate, the first layer exhibiting hole injection properties.

Second step: Forming a bank material layer above the first layer by using bank material.

Third Step: Forming banks by patterning the bank material layer, while forming a resin film on a surface of the first layer by attaching a portion of the bank material layer to the first layer, the banks defining apertures corresponding to light-emitters.

Fourth step: Forming a functional layer by applying ink to the apertures such that the ink has contact with the resin film, the ink containing organic material, and the functional layer including an organic light-emitting layer Fifth step: Forming a second layer above the functional layer, the second layer exhibiting electron injection properties.

Sixth step: Degrading the hole injection properties of the first layer by applying power to an element structure formed by performing the first to the fifth step.

According to the method of manufacturing an organic light-emitting element pertaining to one aspect of the present invention, it is possible to prevent degradation over time of the luminance, and to manufacture organic light-emitting elements with an extended lifetime. The inventors and the likes of the present invention assume the mechanism which achieves such effects as follows.

According to the method of manufacturing an organic light-emitting element pertaining to one aspect of the present invention, an element structure having a resin film is first formed. The resin film contains resin material, and is intervened between the first layer and the light-emitting layer, where the first layer exhibits hole injection properties. Power is applied to this element structure in the sixth step, and thus an organic light-emitting element is formed. Hence, the hole injection properties of the manufactured organic light-emitting element have been degraded from the initial properties.

Therefore, it is likely that the carrier balance between the electron injection properties of the second layer, which tend to be degraded more than the hole injection properties over time of power application (driving time), and the hole injection properties of the first layer, which have been degraded in advance, is maintained for a longer period than conventional organic light-emitting elements (without a resin film as described above). As a result, the organic light-emitting element is prevented from degradation over time of the luminance, and achieves an extended lifetime.

In addition, according to the method of manufacturing an organic light-emitting element pertaining to one aspect of the present invention, an organic light-emitting element having a resin film, which is formed from resin material contained in the bank material layer and is intervened between the first layer exhibiting hole injection properties and the light-emitting layer, can be manufactured in a series of manufacturing processes. Hence, it is unnecessary to add a new step of forming the resin film, and this suppresses the increase in the manufacturing cost.

Regarding the prevention of degradation over time of luminance, the inventors and the likes of the present invention assume the following mechanism.

In display devices pertaining to conventional technology, it can be assumed that degradation of the luminance after the passage of a long driving time is caused by disruption of the carrier balance between the electrons and holes injected to the light-emitting layer. Such an imbalance is presumably caused by degradation of the electron injection properties which results in a "hole-rich condition". Note that the term "hole-rich condition" means a condition where holes are relatively abundant in comparison with the amount of electrons.

In contrast, according to the manufacturing method pertaining to one aspect of the present invention, a resin film is formed from a bank material layer, and is inserted between the first layer and the light-emitting layer, and power application is then performed. This acts on the hole transport layer (interlayer) and the hole injection layer, for example, of the first layer, and degrades the hole injection properties in advance. Therefore, in the organic light-emitting element manufactured according to the manufacturing method pertaining to one aspect of the present invention, the carrier balance between the electrons and holes injected to the light-emitting layer is maintained in the electron-rich condition. This reduces the degradation speed.

In the method of manufacturing an organic light-emitting element pertaining to one aspect of the present invention, a thickness of the resin film formed in the third step may be greater than 0 nm and not greater than 4 nm. From results of experiment, the above-described effect is not observed in an element manufactured without a bank formation step (i.e. an element in which the hole transport layer (interlayer), the hole injection layer and the light-emitting layer, for example, of the first layer have been formed by spin coating or the like). In an element which achieves the above-mentioned effect, it was found by using a TEM that the film thickness of the resin layer between the first layer having the hole injection properties and the light-emitting layer is 4 nm.

In the method of manufacturing an organic light-emitting element pertaining to one aspect of the present invention, the power application to the element structure in the sixth step may be performed so as to reduce mobility of holes in the element structure to be not higher than $1/10$ of the mobility before the power application. By applying power to the element structure with the resin film, the carrier balance between the electrons and the holes to be injected to the light-emitting layer will be maintained in the electron-rich condition, even after a long driving time.

In the method of manufacturing an organic light-emitting element pertaining to one aspect of the present invention, the power application to the element structure in the sixth step may be performed for a period longer than 0 minutes and not longer than 30 minutes under a condition where the element structure exhibits a luminance not lower than a luminance for practical use and not higher than three times the luminance for practical use. By applying power to the element structure with the resin film, the carrier balance between the electrons and the holes to be injected to the light-emitting layer will be maintained in the electron-rich condition, even after a long driving time.

In the method of manufacturing an organic light-emitting element pertaining to one aspect of the present invention, the first step may include: an anode forming step of forming an anode above the substrate; and a hole injection layer forming step of forming a hole injection layer above the anode by using a tungsten oxide, and the first layer may be formed to include the anode and the hole injection layer. When such a structure of the first layer is adopted, the resin film, which is formed from part of the bank material layer, is to be inserted between the hole injection layer and the light-emitting layer. This degrades the hole injection properties of the light-emitting layer in advance, and the carrier balance between the electrons and holes injected to the light-emitting layer is maintained in the electron-rich condition. As a result, it is possible to prevent degradation over time of the luminance, and to achieve a longer lifetime.

In the method of manufacturing an organic light-emitting element pertaining to one aspect of the present invention, in the third step, a portion of the first layer may be dissolved in developer used for patterning the bank material layer, so that a dent is formed in an area on a surface of the first layer facing the functional layer, and the resin film may be formed in the dent of the first layer.

In this way, by providing a dent in the surface of the hole injection layer and forming a resin film in the dent by accumulating a portion of the bank material layer dissolved in the developer during the development, it is possible to stably form the resin film between the hole injection layer and the light-emitting layer. Thus, when this aspect of the present invention is adopted, the carrier balance is more surely kept in the electron-rich condition. This prevents degradation over time of the luminance and leads to a longer lifetime of organic light-emitting elements to be manufactured.

In the method of manufacturing an organic light-emitting element pertaining to one aspect of the present invention, in the hole injection layer forming step, a gas composed of argon gas and oxygen gas may be used as a gas enclosed in a chamber of a sputtering device, and the hole injection layer using a tungsten oxide may be farmed under the following specific conditions: a total pressure of the gas in the chamber is higher than 2.7 Pa and lower than or equal to 7.0 Pa; a partial pressure ratio of the oxygen gas is higher than or equal to 50% and lower than or equal to 70% with respect to the total pressure of the gas in the chamber; and an input power density per unit surface area of a sputtering target is higher than or equal to 1 W/cm$^2$ and lower than or equal to 2.8 W/cm$^2$.

When the conditions above are adopted, prevention of degradation over time of the luminance and reduction of the driving voltage to be applied to the organic light-emitting element are achieved together. The reduction of the driving voltage is due to the preferable hole injection properties of the hole injection layer. Thus, the conditions above further extend the lifetime of an organic light-emitting element.

More specifically, an organic light-emitting element is formed first such that the element has a structure in which the bank resin layer containing resin material for forming the bank is inserted between the hole injection layer and the light-emitting layer. Then, power is applied to the element structure in the sixth step. Thus, the organic light-emitting element is manufactured. The hole injection efficiency of the organic light-emitting element is therefore lower than the initial properties, and the carrier balance between the electron injection properties and the hole injection properties will be kept stable for a longer time than an organic light-emitting element having a conventional structure. Hence, the degradation over time of the luminance is prevented, which leads to a longer lifetime.

However, with the manufacturing method pertaining to one aspect of the present invention, since the hole injection efficiency is lower than the initial properties and the bank resin layer is intervened between the hole injection layer and the light-emitting layer, it can be assumed that the driving voltage required for desired luminance is high. Therefore, an adverse effect of the high voltage on the lifetime is a concern.

In view of this assumption, the hole injection layer is formed under the conditions mentioned above, which suppresses the hole injection barrier between the hole injection layer and the light-emitting layer to a low level. As a result, the organic light-emitting element has good hole injection properties, and it is unnecessary to increase the driving voltage to be applied to the organic light-emitting element. For this reason, the organic light-emitting element achieves a long lifetime.

In the method of manufacturing an organic light-emitting element pertaining to one aspect of the present invention, the bank material used in the second step may contain a photosensitive resin component and a fluorine component, and in the third step, the banks defining the apertures may be formed by patterning the bank material layer by exposing a portion of the bank material layer and developing the portion by using developer.

In the method of manufacturing an organic light-emitting element pertaining to one aspect of the present invention, the fifth step may include: an electron transport layer forming step of forming an electron transport layer above the functional layer; a cathode forming step of forming a cathode above the electron transport layer; and a sealing layer forming step of forming a sealing layer above the cathode, and the second layer may be formed to include the electron transport layer, the cathode and the sealing layer.

In the method of manufacturing an organic light-emitting element pertaining to one aspect of the present invention, the resin film may be formed as a layer coating an entire surface of the first layer, and the functional layer is formed to be in contact with the resin film. This structure achieves even higher hole injection efficiency.

An organic light-emitting device pertaining to one aspect of the present invention is characterized by having an organic light-emitting element manufactured by any of the manufacturing methods described above. With such a structure, the organic light-emitting device achieves the same advantageous effects as described above.

An organic display panel pertaining to one aspect of the present invention is characterized by having an organic light-emitting element manufactured by any of the manufacturing methods described above. With such a structure, the organic display panel achieves the same advantageous effects as described above.

An organic display device pertaining to one aspect of the present invention is characterized by having an organic light-emitting element manufactured by any of the manufacturing methods described above. With such a structure, the organic display device achieves the same advantageous effects as described above.

An organic light-emitting element pertaining to one aspect of the present invention is a device manufactured by applying power to the element structure, and has the following structure.

In the organic light-emitting element pertaining to one aspect of the present invention, the element structure comprises: a first layer exhibiting hole injection properties; a second layer facing the first layer and exhibiting hole injection properties; a functional layer disposed between the first layer and the second layer, containing organic material, and including a light-emitting layer; banks facing the first layer, partitioning the light-emitting layer, and formed by patterning a bank material layer containing resin material; and a resin film disposed between the first layer and the light-emitting layer, and formed from the resin material contained in the bank material.

In the organic light-emitting element pertaining to one aspect of the present invention, the functional layer containing the organic light-emitting layer is formed to be in contact with the resin film formed on the surface of the first layer, and the hole injection properties has been degraded in advance by the power application. As a result, the balance between the hole injection properties and the electron injection properties in the organic light-emitting element pertaining to one aspect of the present invention is maintained even after the passage of a long driving time. Hence, the organic light-emitting element pertaining to one aspect of the present invention achieves a high luminous efficiency regardless of the length of the driving time.

Moreover, in the organic light-emitting element pertaining to one aspect of the present invention, the resin film is made from resin material contained in the bank material layer, is not formed by a new step particularly for forming the resin film. This suppresses the increase in the manufacturing cost.

Hence, the organic light-emitting element pertaining to one aspect of the present invention achieves a high luminous efficiency regardless of the length of the driving time.

In the organic light-emitting element pertaining to one aspect of the present invention, the first layer may include an anode and a hole injection layer disposed above the anode, and the hole injection layer may contain a tungsten oxide, and have, in an electronic state thereof, an occupied energy level that is 1.8 eV to 3.6 eV lower than the lowest energy level of a valence band of the hole injection layer, in terms of binding energy.

With this structure, due to the occupied energy level, the hole injection barrier between the hole injection layer and the organic light-emitting layer is suppressed to a low level. With such a structure, the hole injection efficiency is improved. Hence, the organic light-emitting element is capable of being driven at a low voltage, and achieving excellent luminous efficiency. This is advantageous effects of the organic light-emitting drive.

In the organic light-emitting element pertaining to one aspect of the present invention, regarding the hole injection layer, its ultraviolet photoelectron spectroscopy (UPS) spectrum may exhibit an upward protrusion between a point 1.8 eV lower than the lowest energy level of the valence band and another point 3.6 eV lower than the lowest energy level of the valence band, in terms of binding energy.

The occupied energy level near the Fermi surface, which can be observed as a spectral protrusion near the Fermi surface, indicates that the hole injection efficiency is high. That is, it has been frequently reported that existence of the occupied energy level near the Fermi surface, which can be seen in a thin film or a crystal of tungsten oxide, derives from oxygen vacancy or a structure similar thereto.

More specifically, assumption has been made that the existence of the occupied energy level near the Fermi surface derives from a binding orbital formed by 5d orbitals of adjacent tungsten atoms or from a 5d orbital of a singular tungsten atom which is not terminated with an oxygen atom and which exists at the surface of a film or within a film. It is assumed that such 5d orbitals, when either in semi-occupied state or unoccupied state, are capable of pulling an electron off of the highest occupied molecular orbital of an organic molecule when contact is formed therebetween. The pulling of an electron from the organic molecule performed by the 5d orbital is believed to have the effect of stabilizing the energy state of both the tungsten atom and the organic molecule.

As a matter of fact, a report has been made that, when a layer composed of α-NPD, which is a small organic molecule, is layered on a thin film of molybdenum oxide, electrons transfer from the α-NPD molecule to the molybdenum oxide thin film (Hiromi Watanabe et al., Yuki EL Tohronkai Dai 7 Kai Reikai Yokoushuu, 17 (2008)). Here, explanation is provided concerning molybdenum oxide since molybdenum oxide has many common physical properties similar to those of tungsten oxide, such as a catalyst effect, electrochromism, and photochromism.

The inventors and the likes of the present invention have arrived at the conception that, in the case of tungsten oxide, a semi-occupied 5d orbital or a structure similar thereto of a single tungsten atom corresponds to the occupied energy level near the Fermi surface. The semi-occupied 5d orbital is lower in terms of binding energy than a binding orbital of 5d orbitals of adjacent tungsten atoms.

In the organic light-emitting element pertaining to one aspect of the present invention, regarding the hole injection layer, its X-ray photoelectron spectroscopy (XPS) spectrum of the hole injection layer may exhibit an upward protrusion between a point 1.8 eV lower than the lowest energy level of the valence band and another point 3.6 eV lower than the lowest energy level of the valence band, in terms of binding energy.

In the organic light-emitting element pertaining to one aspect of the present invention, an area on a surface of the first layer facing the functional layer may have a dent, and the resin film may be formed in the dent of the first layer. With such a structure, it is possible to stably form the resin film between the hole injection layer and the light-emitting layer as described above. Thus, when the aspect of the present invention is adopted, the carrier balance is more surely kept in the electron-rich condition. This prevents degradation over time of the luminance and leads to a longer lifetime of organic light-emitting elements to be manufactured.

In the organic light-emitting element pertaining to one aspect of the present invention, the resin film may be formed as a layer coating an entire surface of the first layer, and the functional layer is formed to be in contact with the resin film. This structure achieves even higher electron injection efficiency.

An organic light-emitting device pertaining to one aspect of the present invention is characterized by having any of the organic light-emitting elements described above. With such a structure, the organic light-emitting device achieves the same advantageous effects as described above.

An organic display panel pertaining to one aspect of the present invention is characterized by having any of the organic light-emitting elements described above. With such a structure, the organic display panel achieves the same advantageous effects as described above.

An organic display device pertaining to one aspect of the present invention is characterized by having any of the organic light-emitting elements described above. With such a structure, the organic display device achieves the same advantageous effects as described above.

The following describes the structure, effects and advantages, with reference to specific examples.

[Embodiment 1]

1. Manufacturing Method

The following describes manufacturing methods and structures of a display panel 10 pertaining to Embodiment 1 and a display device including the same, with reference to FIGS. 1 through 7.

Figure 2A:
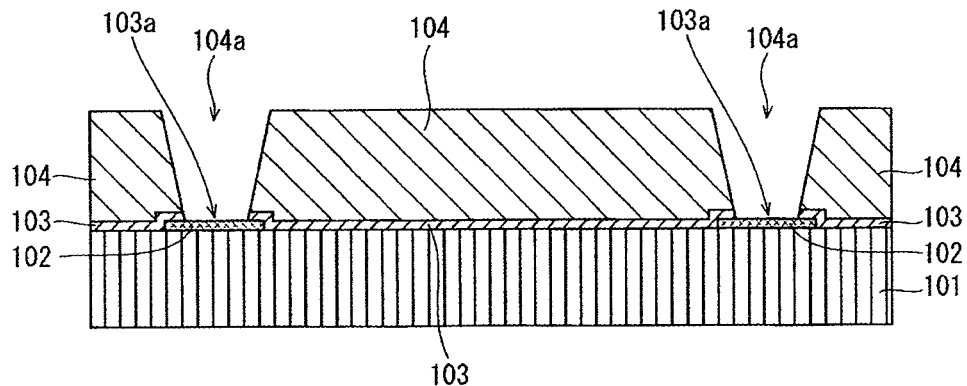
FIGS. 2A-2C are schematic cross-sectional views showing part of the manufacturing process of the display device 1.

As shown in FIG. 2A, a TFT (Thin Film Transistor) layer and a passivation film 103 are sequentially layered on one main surface of the substrate 101, and an interlayer insulation film 104 is further formed thereon. In FIG. 2A, regarding the TFT layer, note that only TFT drains 102 are depicted. Also, the interlayer insulation film 104 depicted in FIG. 2A is in the state where a contact hole 104*a* has been provided above the TFT drain 102 by patterning (Step S1 in FIG. 1). Here, in the bottom of the contact hole 104*a*, the passivation film 103 has been removed as well (aperture 103*a*).

In the above-described structure, the interlayer insulation film 104 is formed from an organic compound such as polyimide and polyamide.

Figure 2B:
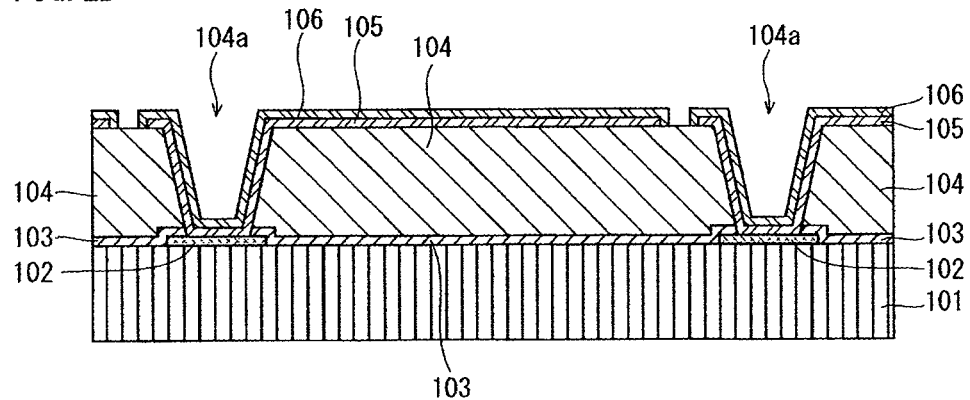

Next, as shown in FIG. 2B, a reflective anode 105 and a transparent conductive film 106 are sequentially layered on the surface of the interlayer insulation film 104 and the surface of the TFT drains 102 which is exposed (Step S2 in FIG. 1). The reflective anode 105 is formed from, for example, aluminum (Al) or its alloy by a sputtering method, a vacuum deposition method, or the like, and is partitioned into sub-pixels by etching. The reflective anode 105 is connected to the TFT drain 102 at the bottom of the contact hole 104*a*.

The transparent conductive film 106 is formed from, for example, ITO (Indium Tin Oxide) or IZO (Indium Zinc Oxide). Similar to the above, the transparent conductive film 106 is formed by a sputtering method, a vacuum deposition method, or the like, and is partitioned into sub-pixels by etching.

Figure 2C:
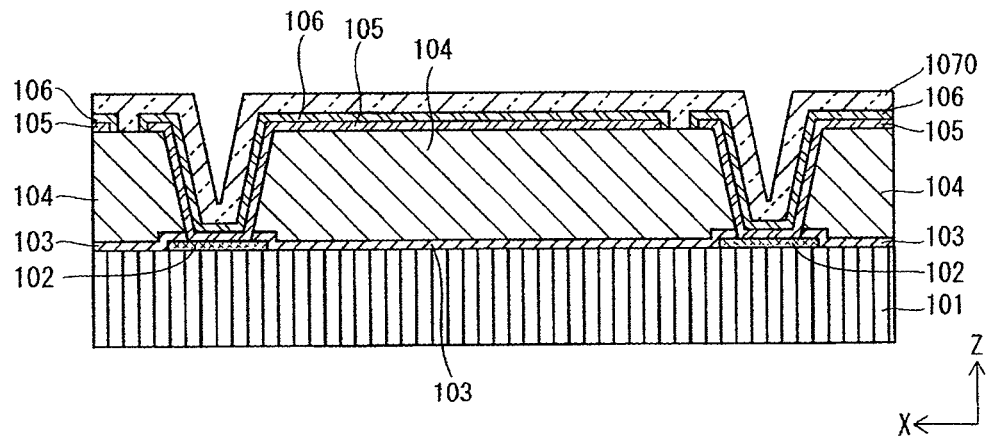

Next, as shown in FIG. 2C, a hole injection preparation layer 1070 is formed to coat the transparent conductive film 106 and a portion of the surface of the interlayer insulation film 104 which is exposed. The hole injection preparation layer 1070 is formed from an oxide of, for example, silver (Ag), molybdenum (Mo), chromium (Cr), vanadium (V), tungsten (W), nickel (Ni) or iridium (Ir). In particular, using tungsten oxide (WO$_X$) is preferable in terms of stable injection of holes and that tungsten oxide has a function to aid the formation of holes (Step S3 in FIG. 1).

The formation of the hole injection preparation layer 1070 with the use of tungsten oxide is performed under the following conditions, for example: using a mixture of an argon gas and an oxygen gas, as a gas to be enclosed in a sputtering device; the total pressure of the gas is greater than 2.7 Pa but not greater than 7.0 Pa, and the ratio of the oxygen partial pressure to the total pressure is from 50% to 70% inclusive; and the input power density per target unit area is from 1 W/cm$^2$ to 2.8 W/cm$^2$ inclusive. The advantages of the above conditions will be described later.

Note that the hole injection preparation layer 1070 may be partitioned into sub-pixels for example, instead of being formed as an allover film as shown in FIG. 2C.

Figure 3A:
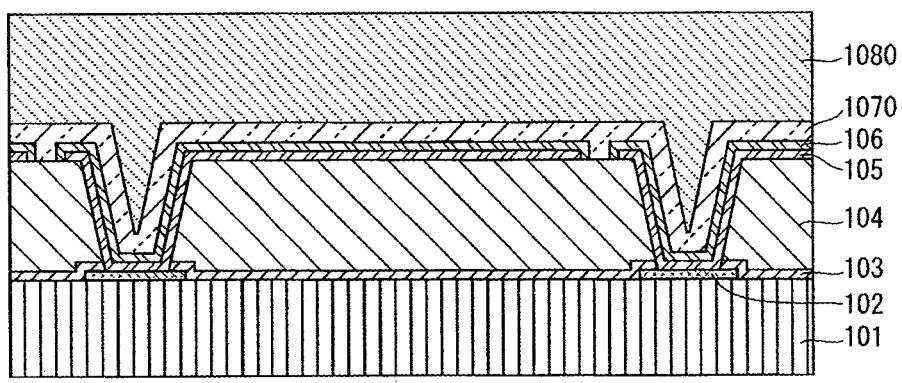
FIGS. 3A-3B are schematic cross-sectional views showing part of the manufacturing process of the display device 1.

Next, as shown in FIG. 3A, a bank material layer 1080 is layered on the hole injection preparation layer 1070. The bank material layer 1080 is formed from, for example, a material containing a fluorine component and a photosensitive resin component, such as an acrylic resin, a polyimide resin, or a novolac-type phenolic resin, by spin coating or the like. As an example of the photosensitive resin material, a negative photosensitive material manufactured by Zeon corporation (product code: ZPN1168) is adopted in this Embodiment.

Figure 3B:
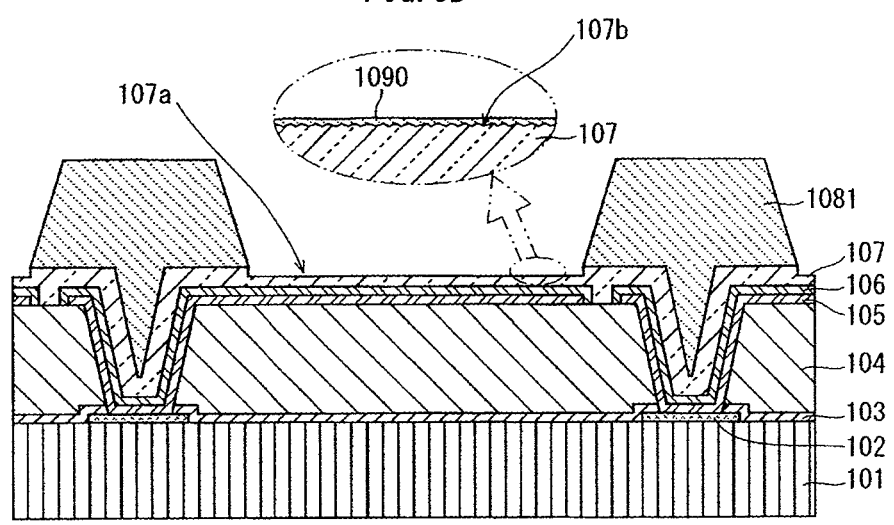

Next, as shown in FIG. 3B, the bank material layer 1080 is subject to patterning, and a bank material layer 1081 for defining an aperture is formed. The bank material layer 1081 may be formed by exposing the surface of the bank material layer 1080 shown in FIG. 3A after covering it with a mask (not depicted), and then performing development.

Note that, as shown in FIG. 3B, the bottom of the aperture in the hole injection layer 107 is dented downward in the Z axis direction (dent 107a), due to development for the formation bank material layer 1081. Also, as shown by the section surrounded by the lines with alternate long and two short dashes in FIG. 3B, the surface 107b of the dent 107a is formed to have concavity and convexity, and a residual layer 1090, which is a part of the bank, remains thereon.

In the formation of the bank material layer 1081 according to this Embodiment, regarding the illuminance in the exposure at all wavelength converted to that of i-line, the exposure amount converted to that of i-line is equal to 25.8 mJ/cm$^2$. After the exposure, heat is applied for 130 sec on a hot plate at 110° C. Then, development by paddling is performed for 180 sec, with use of 2.38% TMAH developer. After the paddling, rinsing is performed with pure water for a sufficient period. The conditions described above are conditions for when the design size of a sub-pixel is 300 μm on the long side and 100 μm on the short side.

Here, according to conventional manufacturing methods, the residual layer is removed by radiating it with UV (ultra violet) or the like. However, in the manufacturing method pertaining to this Embodiment, UV radiation or the like is omitted on purpose, and the residual layer 1090 is left unremoved.

Furthermore, in the present Embodiment, the hole injection layer 107 contains tungsten oxide, and has an occupied energy level that is 1.8 eV to 3.6 eV lower than the lowest energy level of a valence band, in terms of binding energy. Regarding the hole injection layer 107, its ultraviolet photoelectron spectroscopy (UPS) spectrum exhibits an upward protrusion between a point 1.8 eV lower than the lowest energy level of the valence band and another point 3.6 eV lower than the lowest energy level of the valence band, in terms of binding energy. Similarly, its X-ray photoelectron spectroscopy (XPS) spectrum exhibits an upward protrusion between a point 1.8 eV lower than the lowest energy level of the valence band and another point 3.6 eV lower than the lowest energy level of the valence band, in terms of binding energy.

The advantages of the above conditions will be described later.

Figure 4:
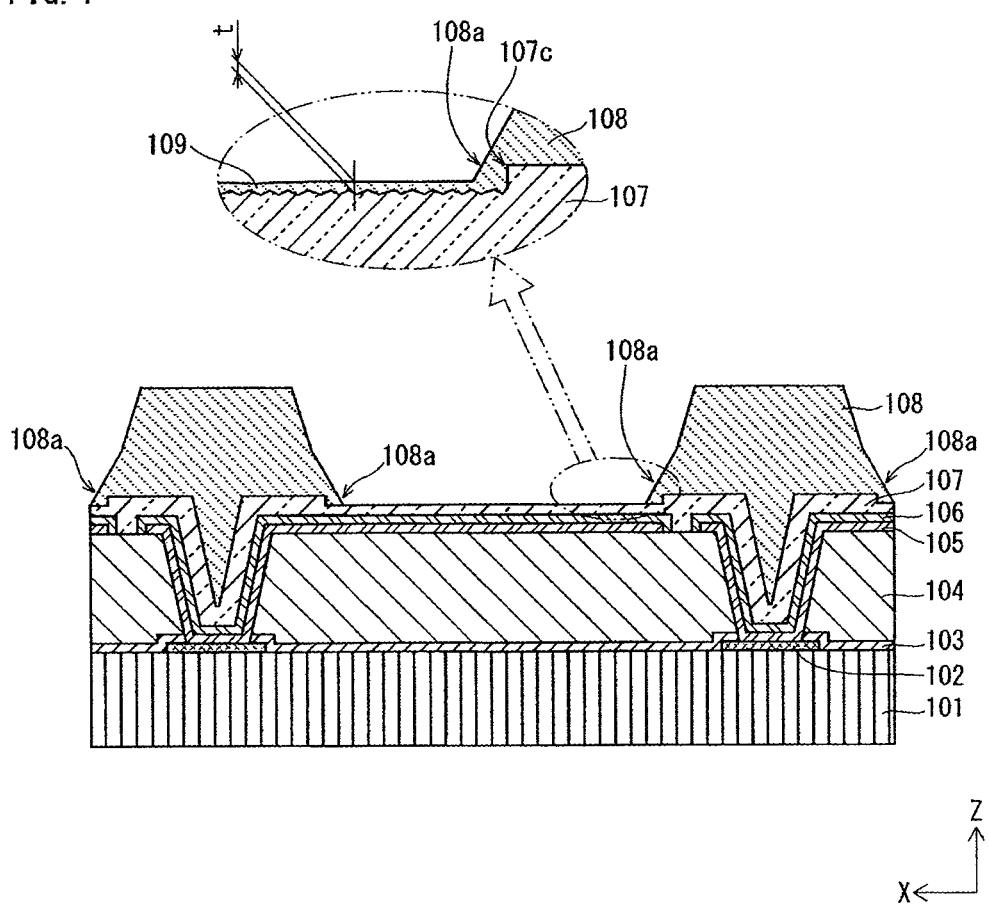
FIG. 4 is a schematic cross-sectional view showing part of the manufacturing process of the display device 1.

Next, as shown in FIG. 4, the work after being rinsed is baked for 1 hour at 200° C. in a clean oven. As a result, a bank 108 is formed. A skirt 108a of the bank 108 covers a dent edge 107c of the dent in the hole injection layer 107, due to flowing of the bank material. At this stage, as shown by the section surrounded by lines with alternate long and two short dashes in FIG. 4, a bank resin layer 109 is formed by the baking so as to coat the surface of the hole injection layer 107 exposed at the bottom of the aperture defined by the bank 108 (Step S4 in FIG. 1). Here, a film thickness t of the bank resin layer 109 is greater than 0 nm but not greater than 4 nm.

The bank resin layer 109 formed in the above-described manner is made of the same material as the bank 108.

Figure 5A:
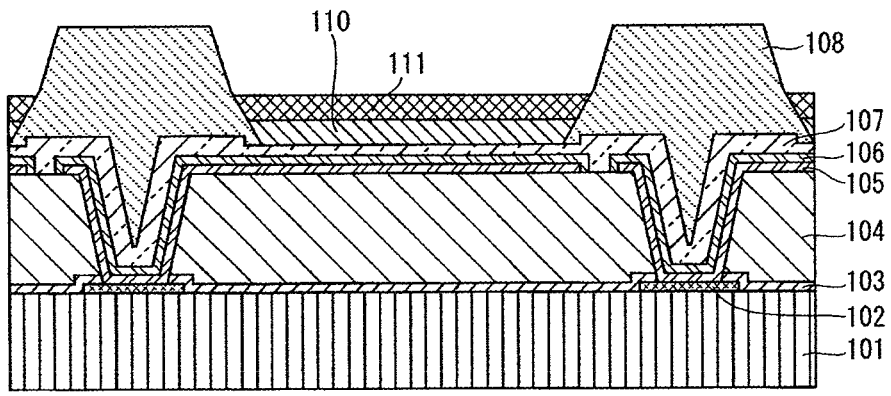
FIGS. 5A-5B are schematic cross-sectional views showing part of the manufacturing process of the display device 1.

Next, as shown in FIG. 5A, a hole transport layer 110 and a light-emitting layer 111 are formed in the aperture defined by the bank 108 (Steps S5 and S6 in FIG. 1). The hole transport layer 110 is made of polymer having no hydrophilic group, such as polyfluorene or its derivative, or polyarylamine or its derivative. The hole transport layer 110 is formed by a printing method, and is subject to baking after the printing.

Examples of the material in the light-emitting layer 111 include a fluorescent material such as an oxinoid compound, perylene compound, coumarin compound, azacoumarin compound, oxazole compound, oxadiazole compound, perinone compound, pyrrolo-pyrrole compound, naphthalene compound, anthracene compound, fluorene compound, fluoranthene compound, tetracene compound, pyrene compound, coronene compound, quinolone compound and aza-quinolone compound, pyrazoline derivative and pyrazolone derivative, rhodamine compound, chrysene compound, phenanthrene compound, cyclopentadiene compound, stilbene compound, diphenylquinone compound, styryl compound, butadiene compound, dicyanomethylene pyran compound, dicyanomethylene thiopyran compound, fluorescein compound, pyrylium compound, thiapyrylium compound, selenapyrylium compound, telluropyrylium compound, aromatic aldadiene compound, oligophenylene compound, thioxanthene compound, anthracene compound, cyanine compound, acridine compound, metal complex of a 8-hydroxyquinoline compound, metal complex of a 2-bipyridine compound, complex of a Schiff base and a group three metal, metal complex of oxine, rare earth metal complex, etc., as recited in Japanese Patent Application Publication No. H5-163488. The light-emitting layer 111 is formed by a printing method, and is subject to baking after the printing.

Here, in the bank 108 viewed in the downward direction along the Z axis, bank portions 108b extending in the direction of the Y axis and bank portions 108c extending in the direction of the Y axis are both formed integrally as shown in FIG. 6. That is, the banks 207 are pixel banks. The light-emitting layer 111 is formed in each aperture defined by the bank portions.

Through the steps described above, the bank resin layer 109 is formed as a layer coating the entire surface of the hole injection layer 107, and the hole transport layer 110 as a part of a functional layer is formed to be in contact with the bank resin layer 109.

Figure 5B:
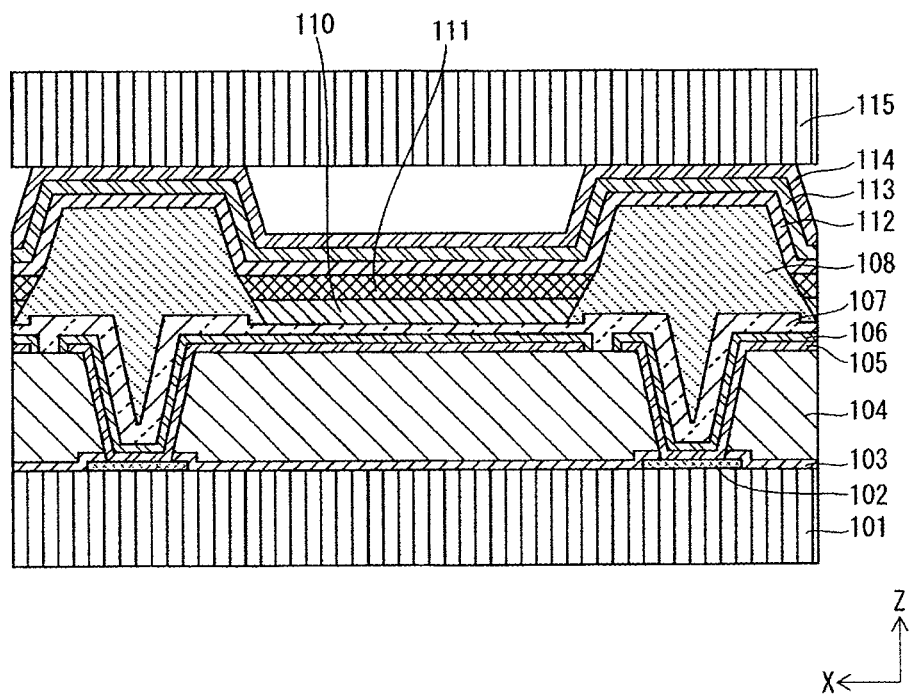

Next, as shown in FIG. 5B, an electron transport layer 112, a transparent cathode 113 and a sealing layer 114 are sequentially layered on both the surface of the light-emitting layer 111 and the exposed surface of the bank 108. After that, a cap substrate 115 is attached (Steps S7-S10 in FIG. 1).

Examples of the material used to form the electron transport layer 112 include an oxadiazole derivative (OXD), a triazole derivative (TAZ), or a phenanthroline derivative (BCP, Bphen). Examples of the material used to form the transparent cathode 113 include ITO or IZO. Examples of the material used to form the sealing layer 114 include silicon nitride (SiN), silicon oxynitride (SiON), etc.

Figure 7:
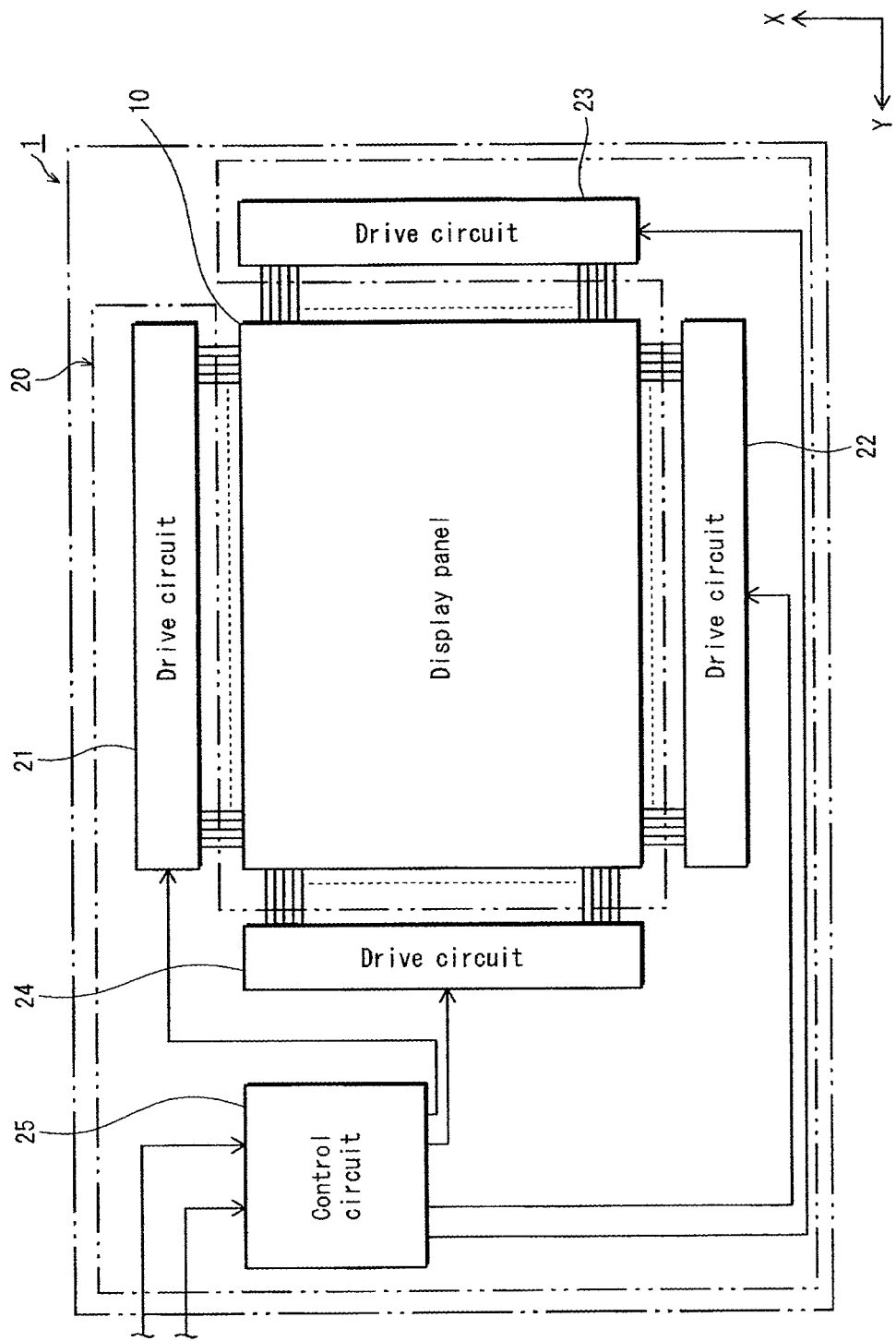
FIG. 7 is a block diagram showing the structure of the display device 1.

Next, as shown in FIG. 7, a drive control unit 20 including drive circuits 21-24 and a control circuit 25 is attached to the display panel 10 manufactured in the above-described manner.

After that, aging is performed on the display panel 10 to which the drive control unit 20 has been attached (Step S11 in FIG. 1). Aging is performed by, for example, applying power to the display panel 10 until the mobility of hole is reduced to 1/10 in comparison with the hole injection properties before the aging. Specifically, power is applied for a period that is longer than 0 min. and not longer than 30 min. under a condition where the display panel 10 exhibits a luminance that is not lower than a luminance for practical use but not higher than three times the luminance for practical use.

The display device 1 is completed by the steps described above.

2. Advantageous Effects

Figure 8:
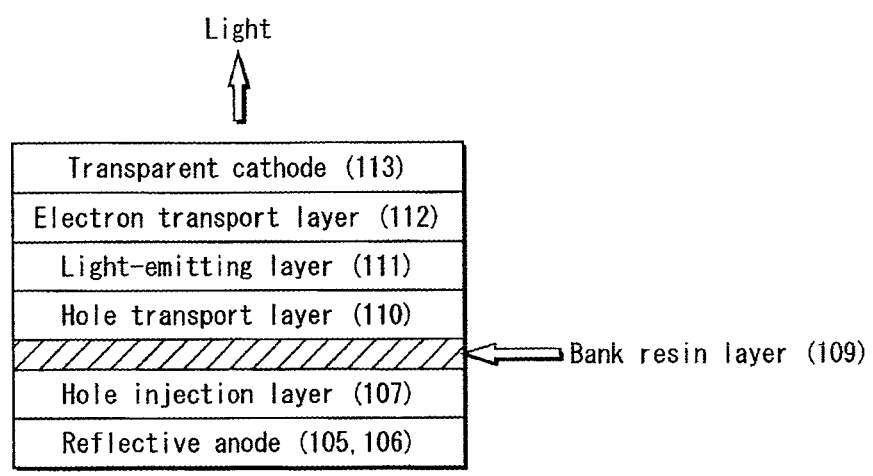
FIG. 8 is a schematic cross-sectional view showing part of an element structure in the display panel 10.
Figure 9A:
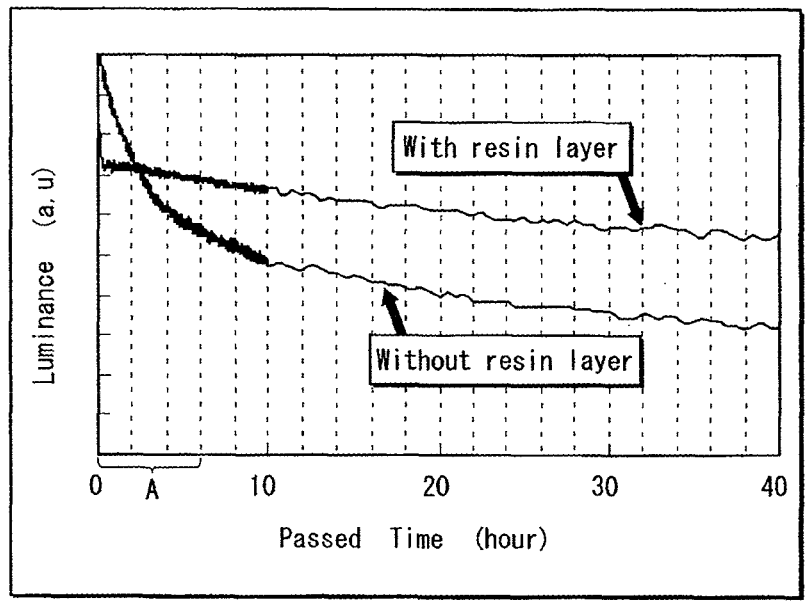
FIGS. 9A-9B are characteristics charts showing lifetime characteristics of the display panel 10.
Figure 9B:
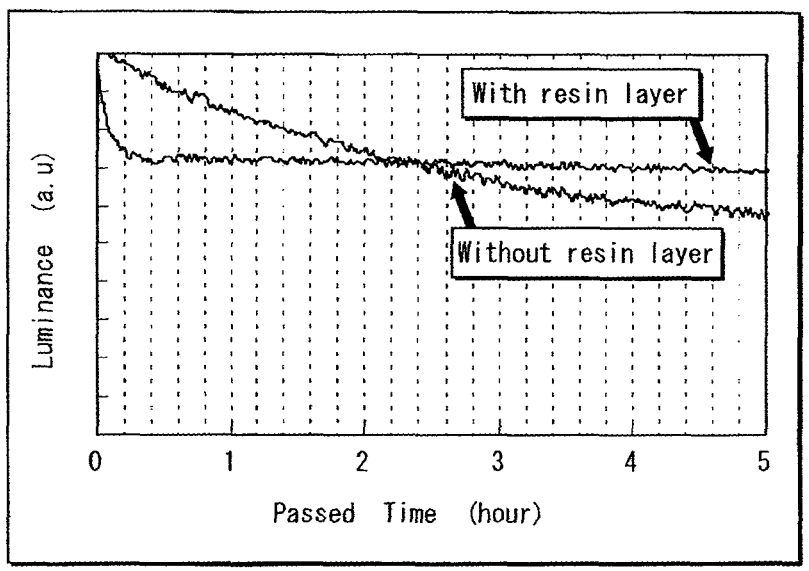

The following explains the advantageous effects of the display panel 10 manufactured in the above-described manner and the display device 1 having the display panel 10, with reference to FIG. 8 and FIGS. 9A and 9B. FIG. 8 is a schematic cross-sectional view showing the element structure as a structure including the layers from the reflective anode 105 to the transparent cathode 113 included in the display panel 10.

In the display panel 10 and the display device 1 obtained by the manufacturing method pertaining to the Embodiment, degradation of luminance over time is prevented, which leads to a long lifetime. The mechanism for realizing such effects can be assumed as follows.

In the display panel 10, as shown in FIG. 8, the bank resin layer 109, which is a resin film including resin material, is inserted between the hole injection layer 107 and the light-emitting layer 111, and more specifically, it is inserted between the hole injection layer 107 and the hole transport layer 110. The display device 1 is manufactured by applying power in the aging step (Step S11 in FIG. 1) under the conditions described above. Hence, the hole injection properties of the display panel 10 of the manufactured display device 1 have been degraded from the initial properties.

Therefore, the carrier balance between the electron injection properties of the transparent cathode 113, which are likely to be lower than the hole injection properties after the passage of a driving time, and the hole injection properties of the reflective anode 105, which have been degraded beforehand, will be maintained longer than conventional display devices (i.e. devices having an element structure without the bank resin layer 109). This prevents degradation over time of the luminance, and extends the lifetime.

Furthermore, in the display panel 10 manufactured according to the manufacturing method pertaining to the Embodiment, the bank resin layer 109 is formed by using the residual layer 1090 which is left after the formation of the bank 108. Therefore, it is unnecessary to add a new step for forming a resin film. This suppresses increase in the manufacturing cost.

Regarding the prevention of degradation over time of luminance, the inventors and the likes of the present invention assume the following mechanism.

In display devices pertaining to conventional technology, it can be assumed that degradation of the luminance after the passage of a long driving time is caused by disruption of the carrier balance between the electrons and holes injected to the light-emitting layer. Such an imbalance is presumably caused by degradation of the electron injection properties which results in the hole-rich condition.

In contrast, in the display device 1 pertaining to the Embodiment, the bank resin layer 109 as a resin film formed by using the residual layer 1090 is inserted between the hole injection layer 107 and the hole transport layer 110 and aging is performed thereon. Thus, the hole injection properties of the hole injection layer 107 have been degraded beforehand. Therefore, in the display panel 10 and display device 1 manufactured according to the method pertaining to the Embodiment, the carrier balance between the electrons and holes injected to the light-emitting layer 111 is maintained in the electron-rich condition. This reduces the degradation speed.

Here, as described above, the film thickness of the bank resin layer 109 is determined to be greater than 0 nm but not to be greater than 4 nm. This is for the following reasons.

One reason is that, from results of experiment, the above-described effect is not observed in a device manufactured without a bank formation step (i.e. a device in which the hole transport layer (interlayer), the hole injection layer and the light-emitting layer, for example, of the first layer have been formed by spin coating or the like). Another reason is that in a device which achieves the above-mentioned effect, it was found by using a TEM that the film thickness of the resin layer between the first layer having the hole injection properties and the light-emitting layer is 4 nm.

As described above, in the step of forming the hole injection layer 107 (Step S3 in FIG. 1) included in the manufacturing method pertaining to the Embodiment, the formation of the hole injection layer with the use of tungsten oxide is performed under the following conditions, for example: using a mixture of an argon gas and an oxygen gas, as a gas to be enclosed in a sputtering device; the total pressure of the gas is greater than 2.7 Pa and no greater than 7.0 Pa, and the ratio of the oxygen partial pressure to the total pressure is from 50% to 70% inclusive; and the input power density per target unit area is from 1 W/cm$^2$ to 2.8 W/cm$^2$ inclusive. These specific conditions lead to the following effects.

When the conditions described above are adopted, prevention of degradation over time of the luminance and reduction of the driving voltage to be applied to the display panel 10 are achieved together. The reduction of the driving voltage is due to the preferable hole injection properties of the hole injection layer 107. Thus, the conditions above further extend the lifetime of an organic light-emitting element.

More specifically, an organic light-emitting element is formed first such that the device has a structure in which the bank resin layer 109 containing resin material for forming the bank 108 is inserted between the hole injection layer 107 and the light-emitting layer 111. Then, aging is performed on the element structure by applying power thereto. Thus, the display panel 10 is manufactured. The hole injection efficiency of the display panel 10 is therefore lower than the initial properties, and the carrier balance between the electron injection properties and the hole injection properties will be kept stable for a longer time than a display panel having a conventional structure. Hence, the degradation over time of the luminance is prevented, which leads to a longer lifetime.

However, in the display panel 10 pertaining to the Embodiment, since the hole injection efficiency is lower than the initial properties and the bank resin layer 109 is inserted between the hole injection layer 107 and the light-emitting layer 111, it can be assumed that the driving voltage required for desired luminance is high. Therefore, an adverse effect of the high voltage on the lifetime is a concern.

In view of this assumption, the hole injection layer 107 (hole injection preparation layer 1070) is formed under the conditions mentioned above, which suppresses the hole injection barrier between the hole injection layer 107 and the light-emitting layer 111 to a low level. As a result, the display panel 10 has good hole injection properties, and it is unnecessary to increase the driving voltage to be applied to the display panel 10. For this reason, the display panel 10 and the display device 1 having the display panel 10 achieves a long lifetime.

As shown in FIG. 4, the display panel 10 pertaining to this Embodiment has a structure in which the dent 107a is provided in the hole injection layer 107. The dent 107a is formed in an area of the surface of the hole injection layer 107, the area facing the light-emitting layer 111, so as to be dented downward in the Z axis direction. The dent 107a is formed in the course of the development with the use of developer, which is performed in the patterning of the bank material layer 1080. The bank resin layer 109 is formed in the dent 107a in the hole injection layer 107. As described above, since the dent 107a is provided in the surface of the hole injection layer 107, and the bank resin layer 109 is formed in the dent 107a, the bank resin layer 109 is kept stable between the hole injection layer 107 and the light-emitting layer 111. Thus, the carrier balance in the display panel 10 is more surely kept in the electron-rich condition, which prevents degradation over time of the luminance and leads to a longer lifetime.

As described above, in the display panel 10 pertaining to this Embodiment, the hole injection layer 107 contains tungsten oxide and has, in an electronic state thereof, an occupied energy level that is 1.8 eV to 3.6 eV lower than the lowest energy level of a valence band of the hole injection layer, in terms of binding energy. With this structure, due to the occupied energy level, the hole injection barrier between the hole injection layer 107 and the light-emitting layer 111 is suppressed to a low level. Accordingly, in the display panel 10 pertaining to this Embodiment having such a structure, the hole injection efficiency is improved. Hence, the display panel 10 is capable of being driven at a low voltage, and achieving excellent luminous efficiency. This is advantageous effects of the display panel 10.

Regarding the hole injection layer 107, its ultraviolet photoelectron spectroscopy (UPS) spectrum exhibits an upward protrusion between a point 1.8 eV lower than the lowest energy level of the valence band and another point 3.6 eV lower than the lowest energy level of the valence band, in terms of binding energy. The occupied energy level near the Fermi surface, which can be observed as a spectral protrusion near the Fermi surface, indicates that the hole injection efficiency is high. That is, it has been frequently reported that existence of the occupied energy level near the Fermi surface, which can be seen in a thin film or a crystal of tungsten oxide, derives from oxygen vacancy or a structure similar thereto.

More specifically, assumption has been made that the existence of the occupied energy level near the Fermi surface derives from a binding orbital formed by 5d orbitals of adjacent tungsten atoms or from a 5d orbital of a singular tungsten atom which is not terminated with an oxygen atom and which exists at the surface of a film or within a film. It is assumed that such 5d orbitals, when either in semi-occupied state or unoccupied state, are capable of pulling an electron off of the highest occupied molecular orbital of an organic molecule when contact is formed therebetween. The pulling of an electron from the organic molecule performed by the 5d orbital is believed to have the effect of stabilizing the energy state of both the tungsten atom and the organic molecule.

As a matter of fact, a report has been made that, when a layer composed of α-NPD, which is a small organic molecule, is layered on a thin film of molybdenum oxide, electrons transfer from the a-NPD molecule to the molybdenum oxide thin film (Hiromi Watanabe et al., Yuki EL Tohronkai Dai 7 Kai Reikai Yokoushuu, 17 (2008)). Here, explanation is provided concerning molybdenum oxide since molybdenum oxide has many common physical properties similar to those of tungsten oxide, such as a catalyst effect, electrochromism, and photochromism.

The inventors and the likes of the present invention have arrived at the conception that, in the case of tungsten oxide, a semi-occupied 5d orbital or a structure similar thereto of a single tungsten atom corresponds to the occupied energy level near the Fermi surface. The semi-occupied 5d orbital is lower in terms of binding energy than a binding orbital of 5d orbitals of adjacent tungsten atoms.

Furthermore, as described above, the hole injection layer 107 may be structured such that its ultraviolet photoelectron spectroscopy (UPS) spectrum exhibits an upward protrusion between a point 1.8 eV lower than the lowest energy level of the valence band and another point 3.6 eV lower than the lowest energy level of the valence band, in terms of binding energy.

Regarding the advantageous effects described above, FIGS. 9A and 9B show the results of a lifetime test conducted on samples.

As shown in FIG. 9B, with a sample having a structure in which the bank resin layer 109 is inserted between the hole injection layer 107 and the light-emitting layer 111, the panel luminance at the initial stage is decreased by the aging to a lower level than another sample which does not have a bank resin layer.

However, as shown in FIGS. 9A and 9B, when the driving time is equal to or longer than 2 hr., the luminance of the sample having the bank resin layer 109 is higher than the sample that does not have a bank resin layer. Thus, the lifetime test shows that the display panel 10 pertaining to this Embodiment and the display device 1 having the display panel 10 are advantageous.

Note that the initial luminance shown in FIGS. 9A and 9B is three times the luminance of a display panel for actual use.

3. Verification

The following verifies the mechanism for achieving the above-described advantageous effects, with reference to FIGS. 10 through 14.

Figure 10:
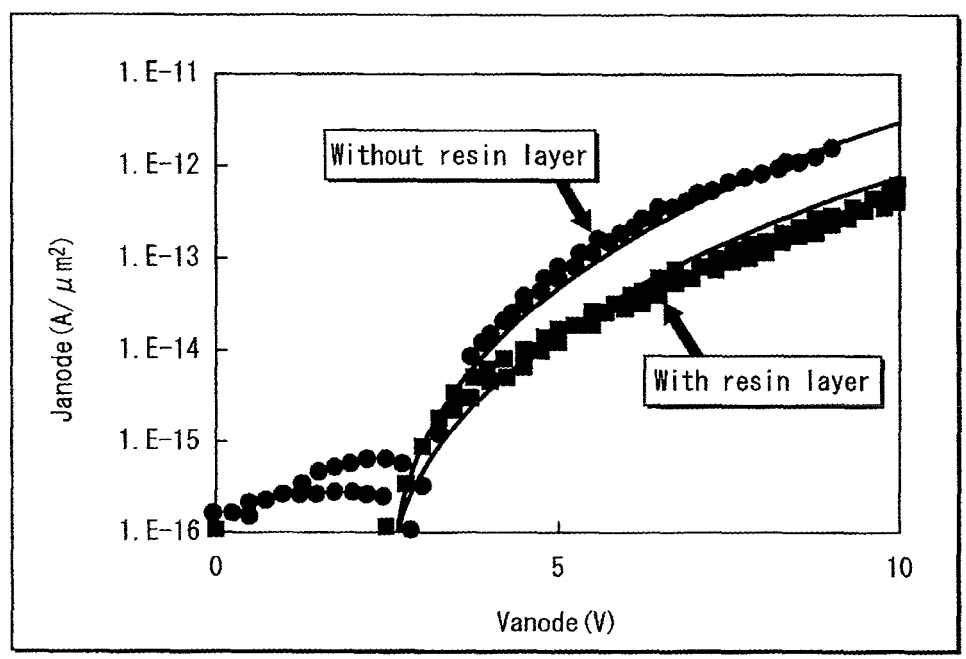
FIG. 10 is a characteristics chart showing I-V characteristics of a hole injection layer 107.

First, FIG. 10 shows I-V characteristics comparing the samples with the bank resin layer 109 inserted and the sample without the bank resin layer 109. In FIG. 10, simulation values are overlaid on experimental values.

As shown in FIG. 10, the sample with the bank resin layer 109 inserted exhibits the mobility of holes that is not greater than the single-digit range of, i.e., 1/10 of, the sample without a bank resin layer.

Figure 11A:
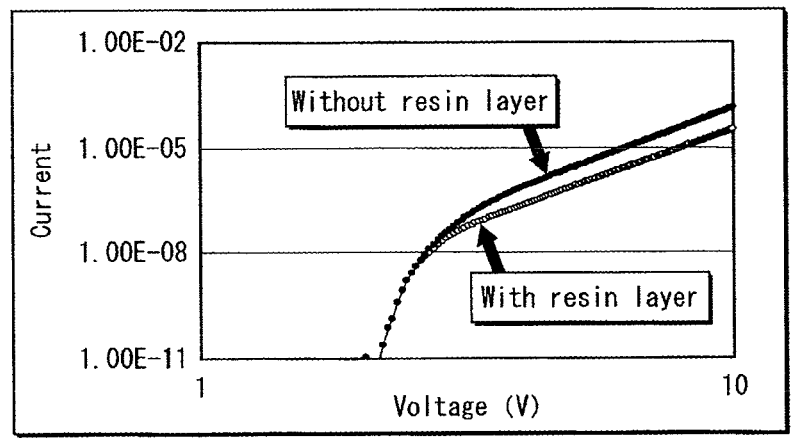
FIG. 11A is a characteristics chart showing hole current characteristics of an element structure.
Figure 11B:
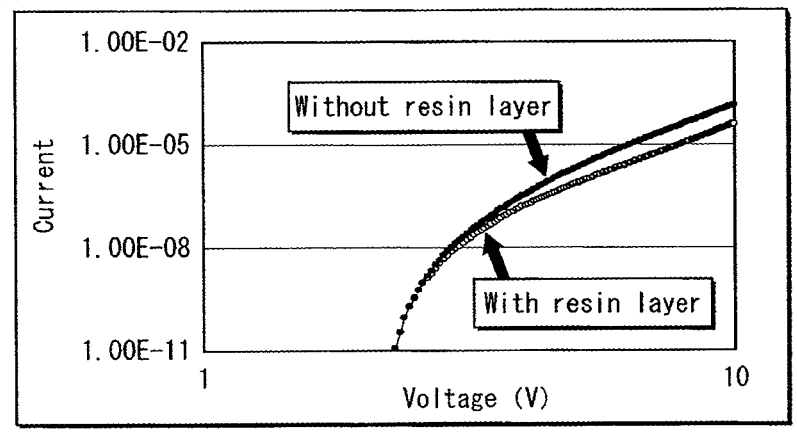
FIG. 11B is a characteristics chart showing electron current characteristics of an element structure.
Figure 11C:
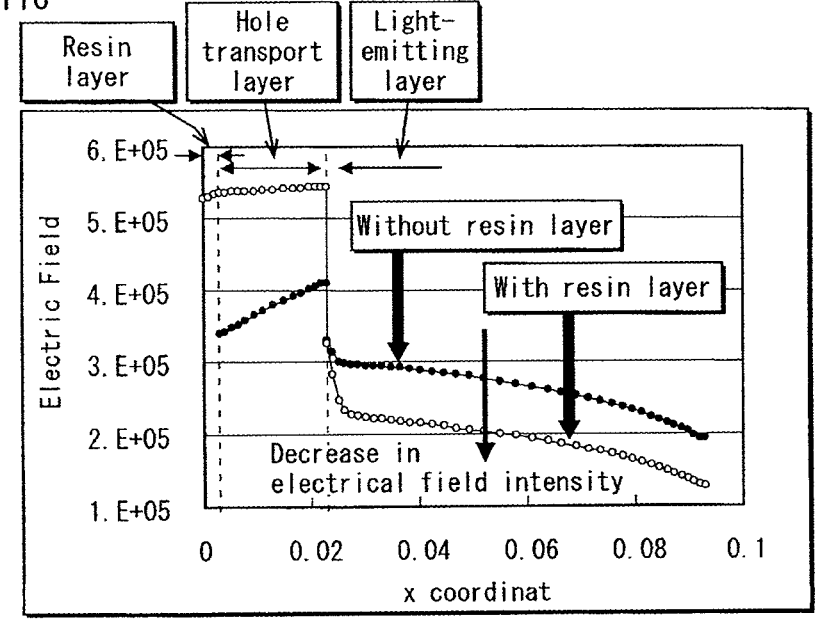
FIG. 11C is a characteristics chart showing electrical field intensity distribution in layers of an element structure.

FIGS. 11A through 11C are characteristics charts showing the results of simulation with the use of parameters that match the experimental values in FIG. 10. FIG. 11A shows the hole current in the device. FIG. 11B shows the electron current. FIG. 11C shows the electrical field intensity distribution in the device.

As shown in FIG. 11A, it can be assumed that the hole current in the sample with the bank resin layer is lower than in the sample without the bank resin layer. Also, as shown in FIG. 11B, it can be assumed that the electron current in the sample with the bank resin layer is lower than in the sample without the bank resin layer. As shown in FIG. 11C, the electrical field intensity distribution in the layers shows that the electrical field intensity in the light-emitting layer is decreased in the sample with the bank resin layer 109.

As described above, when the bank resin layer 109 is inserted between the hole injection layer 107 and the light-emitting layer 111, it can be assumed that the characteristics relating to hole injection and transportation are degraded, and that the electrical field intensity relating to the light-emitting layer is degraded. Hence, the degradation of the hole mobility limits the electron current amount, and it can be assumed that the voltage to be applied to the display panel increases.

To address such a problem and optimize the voltage, tungsten oxide, which exhibits high hole injection properties, is adopted in the hole injection layer 107 of this Embodiment.

Figure 12A:
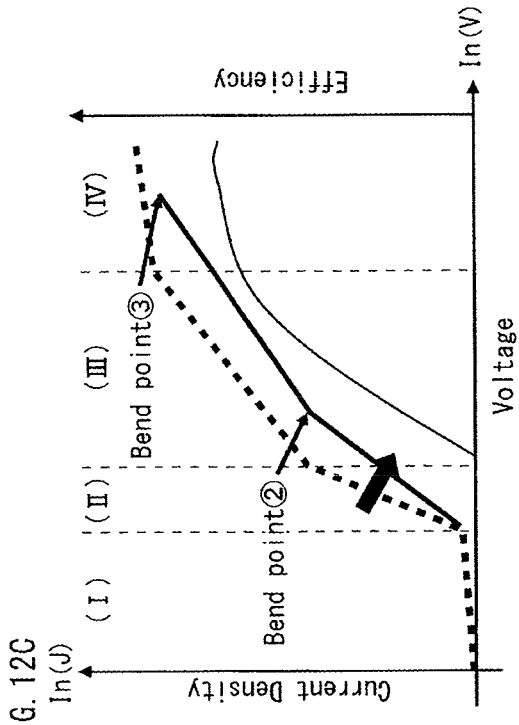
FIGS. 12A and 12B are characteristics charts showing states of carriers in an element structure without insertion of a bank resin layer.
Figure 12B:
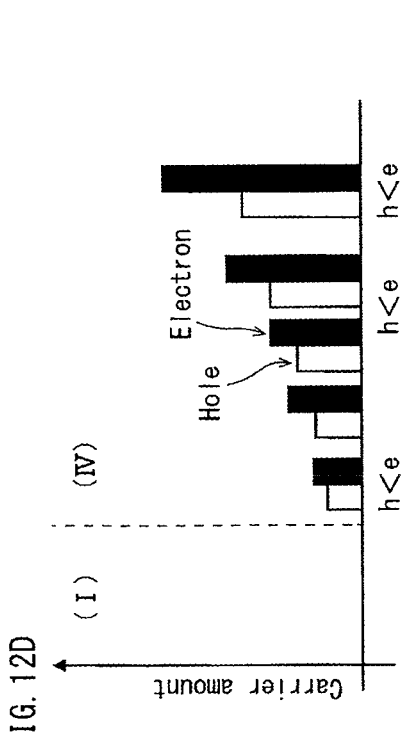
Figure 12C:
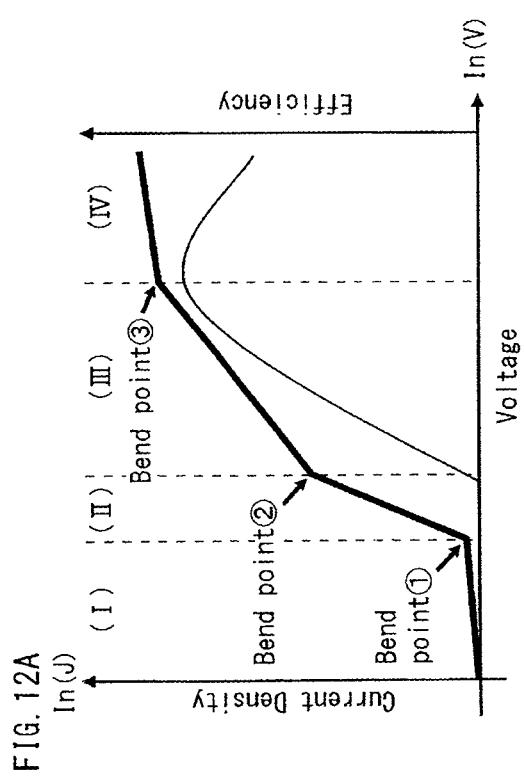
FIGS. 12C and 12D are characteristics charts showing states of carriers in an element structure with insertion of a bank resin layer 109.
Figure 12D:
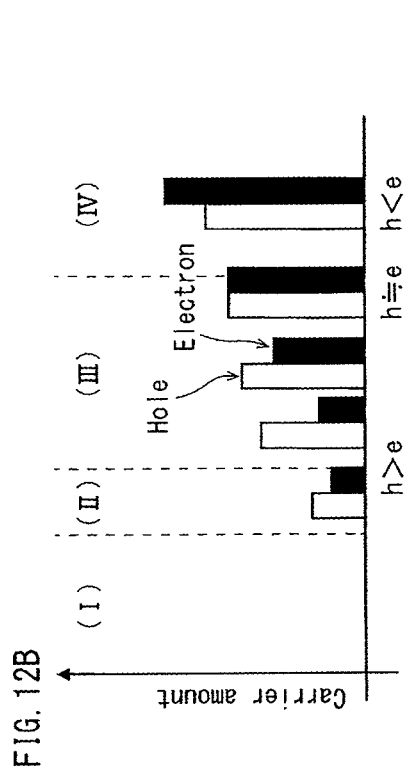

Next, the following describes the mechanism for achieving a long life in the display panel 10 pertaining to Embodiment, with reference to FIGS. 12A through 12D. FIGS. 12A and 12B are schematic diagrams showing the states of carriers in the sample without a bank resin layer, and FIGS. 12C and 12D are characteristics charts showing the states of carriers in the sample with the bank resin layer 109. In FIGS. 12A and 12C, the bend point 1 shows "the start point of the hole injection", the bend point 2 shows the "the start point of the electronic injection" and the bend point 3 shows "the carrier balance optimum point".

First, as shown in FIG. 12C, the bend points 2 and 3 of the sample with the bank resin layer are closer to the ideal model than the sample without a bank resin layer shown in FIG. 12A.

As shown in FIG. 12B, the sample without a bank resin layer is in the "hole-rich state" in the regions (I)-(III).

On the other hand, as shown in FIG. 12D, the sample with the bank resin layer is maintained in a condition where excessive electrons exist ("electron-rich condition"), in all the regions.

Figure 13A:
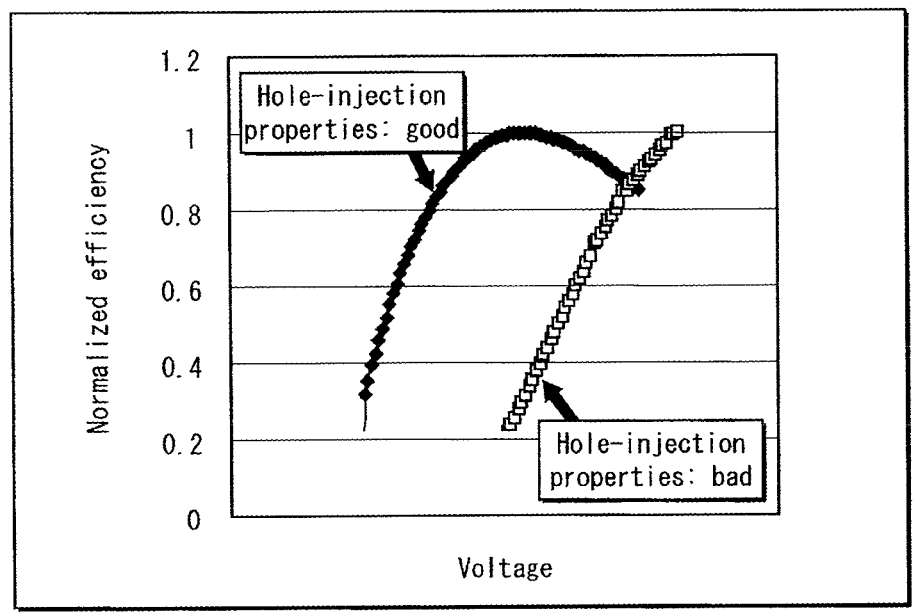
FIG. 13A is a characteristics chart showing a relationship between hole injection properties and a normalized efficiency.

Next, as shown in FIG. 13A, the sample without a bank resin layer and exhibiting a high hole injection efficiency has optimum points of holes and electrons, and therefore has an efficiency peak.

On the other hand, the sample having a bank resin layer and exhibiting a low hole injection efficiency is always in the electron-rich state, and it does not have an efficiency peak.

Figure 13B:
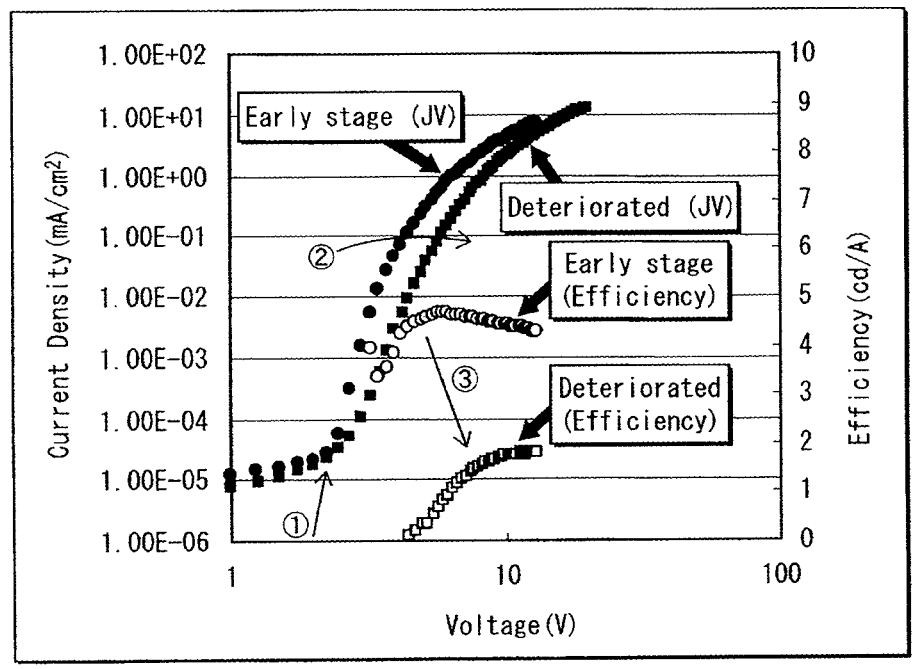
FIG. 13B is a characteristics chart showing an electrical field intensity and a hole current amount in an element structure at an early stage of driving and in an element structure after being deteriorated.

Next, as indicated by the arrow 1 in FIG. 13B, the hole injection start voltage is similar between the initial sample and the degraded sample. On the other hand, as indicated by the arrow 2, the hole current amount is lower in the degraded sample than in the initial sample, and increase in the light-emission start voltage is observed. In view of the above, it can be assumed that the increase in the electronic barrier or the decrease in the electronic transportation causes the degradation of the electrical field intensity relating to the hole transport layer, and that this causes the decrease in the hole current amount.

Furthermore, as indicated by the arrow 3 in FIG. 13B, the voltage at the maximum efficiency is higher in the degraded sample than the initial sample. That is, due to the decrease in the electron current, the carrier balance has come into the hole-rich condition, and the voltage at the bend point 3 has been increased.

Next, as shown in FIGS. 14A and 14B, the CIE value in the initial sample monotonically decreases with the increased driving voltage. Accordingly, as shown in FIG. 14C, the light-emitting point tends to shift toward the cathode with the increased voltage. This indicates, in the initial sample, that the state where excessive holes exist becomes more noticeable with the increased voltage.

On the other hand, as shown in FIGS. 14A and 14B, CIE(x) and CIE(y) in the degraded sample both tend to be smaller than the initial sample (arrow 2). As shown in FIG. 14D, the optical simulation indicates that although the tendency of the light-emitting point to shift toward the cathode is similar, the state where excessive holes exist becomes furthermore noticeable with the increased voltage.

As described above, in the sample with the bank resin layer inserted, the mechanism for extension of the lifetime is as follows: the hole injection amount is decreased at the initial stage, and this maintains the carrier balance between holes and electrons in the electron-rich state even after the electron injection properties are degraded by power application. This prevents the luminous efficiency of the material from being decreased, and achieves a long lifetime.

4. Experiments and Observations (i) Conditions for Forming Tungsten Oxide Film

In this Embodiment, the hole injection layer 107 is yielded by forming a film of tungsten oxide under predetermined conditions. The forming of the tungsten oxide film under such film forming conditions provides the hole injection layer 107 with the occupied energy level near the Fermi surface, which results in the hole injection barrier between the injection layer 107 and the hole transport layer 110 being reduced. Furthermore, the display panel 10 having a hole injection layer formed under such film forming conditions can be driven at a low voltage.

In order as to obtain a tungsten oxide film having the above-described characteristics, a DC magnetron sputtering device is used in the forming thereof. The sputtering target is metal tungsten, and the processing is performed while not controlling substrate temperature, and by introducing argon gas and oxygen gas into the chamber of the sputtering device. In such an environment, the tungsten oxide film is formed by applying the reactive sputtering method under film forming conditions where: (i) gas pressure (total gas pressure) is higher than 2.7 Pa and lower than or equal to 7.0 Pa; (ii) the ratio of oxygen partial pressure to the total gas pressure is higher than or equal to 50% and lower than or equal to 70%; and (iii) input power per unit surface area of the sputtering target (input power density) is higher than or equal to 1 $W/cm^2$ and lower than or equal to 2.8 $W/cm^2$.

The effectiveness of such film forming conditions (i) through (iii) have been proved through the following experiments.

Firstly, the inventors prepared hole-only devices as assessment devices to be used in accurately determining the dependence of the hole injection efficiency, with which holes are injected into the hole transport layer 110 as a buffer layer from the hole injection layer 107, on the conditions under which the tungsten oxide film is formed.

Basically, in an organic EL device, electric current is formed of carriers, which consists of holes and electrons. As such, the electrical characteristics of an organic EL device reflects electron current as well as hole current. However, since, in a hole-only device, the injection of electrons from the cathode is blocked, there is almost no flow of electron current. Thus, electrical current flowing in a hole-only device consists almost entirely of hole current. In other words, it could be considered that only holes function as a carrier in a hole-only device. Thus, a hole-only device is ideal in making an assessment of hole injection efficiency.

In detail, the hole-only devices prepared by the inventors were actually obtained by replacing the transparent cathode 113 illustrated in FIG. 8 with gold (Au) to form a cathode 208 as illustrated in FIG. 15. That is, the inventors obtained the hole-only devices illustrated in FIG. 15 by forming a 50 nm-thick anode 202 composed of an ITO thin film on a substrate 210, and further disposing, on the anode 202 so formed, the following layers in the order in which they are introduced: a 30 nm-thick hole injection layer 203 composed of tungsten oxide; a 20 nm-thick buffer layer (hole transport layer) 204 composed of TFB, which is an organic amine-containing polymer; a 70 nm-thick light-emitting layer 205 composed of F8BT, which is an organic polymer; and a 100 nm-thick cathode 209 composed of gold (Au). Note that, considering that the hole-only devices are devices prepared for the sole sake of assessment, the banks are omitted.

In the manufacturing of the hole-only devices, the hole injection layers 203 of the hole-only devices were similarly formed by applying the reactive sputtering method in a DC magnetron sputtering device. The gas introduced into the chamber was composed of at least one of argon gas and oxygen gas, and the sputtering target used was metal tungsten. Further, no control was performed regarding substrate temperature, while control of argon partial pressure, oxygen partial pressure, and total gas pressure within the chamber was performed by adjusting the flow amount of the respective gases. Further, in order as to obtain the hole-only devices, changes were made to certain film forming conditions, namely total gas pressure, oxygen partial pressure, and input power, as illustrated in Table 1. As a result, hole-only devices 201B (devices No. 1 through 14), each having a hole injection layer 203 formed under different film forming conditions, were obtained. Note that, hereinafter, oxygen partial pressure is indicated as the ratio (%) of the oxygen pressure to the total pressure of the gases in the chamber of the sputtering device.

forming conditions strongly reflects the hole injection efficiency from the hole injection layer 203 to the buffer layer 204.

Table 3 shows, as the results of the experiment performed on each of the hole-only devices 201B, the driving voltages in relation to the film forming conditions, which include the

TABLE 1

Film Forming Conditions of the Hole-only Devices 201B

| | Device No. | | | | | | | | | | | | | |
|---|---|---|---|---|---|---|---|---|---|---|---|---|---|---|
| | 1 | 2 | 3 | 4 | 5 | 6 | 7 | 8 | 9 | 10 | 11 | 12 | 13 | 14 |
| Oxygen Partial Pressure (%) | 70 | 50 | 100 | 50 | 70 | 100 | 70 | 50 | 100 | 50 | 70 | 30 | 30 | 50 |
| Total Pressure (Pa) | 2.7 | 4.8 | 1.7 | 1.7 | 2.7 | 1.7 | 2.7 | 4.8 | 1.7 | 2.7 | 1.7 | 1.7 | 2.7 | 4.8 |
| Input Power (W) | 500 | 500 | 500 | 500 | 250 | 250 | 1000 | 1000 | 1000 | 500 | 500 | 500 | 500 | 250 |
| T-S (mm) | 113 | 113 | 113 | 113 | 113 | 113 | 113 | 113 | 113 | 113 | 113 | 113 | 113 | 113 |
| Film Forming Rate (nm/s) | 0.164 | 0.140 | 0.111 | 0.181 | 0.057 | | 0.308 | 0.311 | 0.246 | 0.154 | 0.153 | 0.364 | 0.177 | 0.049 |
| Film Thickness (nm) | 30 | 30 | 30 | 30 | 30 | 30 | 30 | 30 | 30 | 30 | 30 | 30 | 30 | 30 |

Table 2 illustrates a relation between input power and input power density of the above-presented DC magnetron sputtering device.

TABLE 2

| Input Power (W) | Input Power Density (W/cm$^2$) |
|---|---|
| 250 | 1.4 |
| 500 | 2.8 |
| 1000 | 5.6 |

The inventors connected each of the manufactured hole-only devices 201B to a direct current power supply 211, and applied voltage thereto. Further, the inventors obtained an electric current value per unit surface area (current density) for each of the hole-only devices. More specifically, the voltage applied to the hole-only devices was changed, and a value indicating electric current flowing was obtained at different voltages. Further, conversion was performed on the electric current values to obtain an electric current density value of the hole-only devices. Note that hereinafter, the expression "driving voltage" refers to a voltage to be applied when the current density value is 10 mA/cm$^2$.

In short, it could be said that the smaller the driving voltage, the higher the hole injection efficiency of the hole injection layer 203 is. This is since, the members composing the hole-only devices 201B, except for the hole injection layer 203, are prepared according to the same manufacturing method, and thus, it could be assumed that the hole injection barrier between two adjacent layers, other than the hole injection layer 203, is uniform in each of the hole-only devices 201B. In addition, it has been confirmed through another experiment that the cathode 202 and the hole injection layer 203 used in this experiment are in ohmic contact.

Considering the above, it could be expected that the differences in driving voltage resulting from the different film total pressure, the proportion of the oxygen gas partial pressure, and the input power. Note that the numbers enclosed in circles in Table 3 indicate the device number of each of the hole-only devices 201B.

TABLE 3

Film Forming Conditions and Driving Voltages of the Hole-only Devices 201B (Applied Voltage Value under Electric Current Density of 10 mA/cm$^2$)

| | | Total Pressure | | |
|---|---|---|---|---|
| | | 1.7 Pa | 2.7 Pa | 4.8 Pa |
| Oxygen Partial Pressure | 30% | ⑫ 500 W (Unmeasured) | ⑬ 500 W (19 V) | Film could not be formed |
| | 50% | ④ 500 W (19 V) | ⑩ 500 W (19 V) | ⑭ 250 W (13.7 V) ② 500 W (13.7 V) ⑧ 1000 W (>20 V) |
| | 70% | ⑪ 500 W (Unmeasured) | ⑤ 250 W (14.7 V) ① 500 W (18.2 V) ⑦ 1000 W (>20 V) | Film could not be formed |
| | 100% | ⑥ 250 W (Unmeasured) ③ 500 W (>20 V) ⑨ 1000 W (>20 V) | Film could not be formed | Film could not be formed |

*Numbers enclosed in circles indicate device No., numbers without parenthesis indicate input electricity, and numbers placed in parenthesis indicate driving voltage.

Further, FIGS. 16A through 16C are graphs illustrating the dependence of driving voltages of the hole-only devices 201B on the film forming conditions. Each of the points in FIG. 16A indicates, from left to right in the figure, a driving voltage of the devices No. 4, 10, and 2. Similarly, each of the points in FIG. 16B indicates, from left to right in the figure, a driving voltage of the devices No. 13, 10, and 1. Finally, each of the points in FIG. 16C indicates, from left to right in the figure, a driving voltage of the devices No. 14, 2, and 8.

Here, it should be noted that under the following conditions, the film formation was not successfully performed due to limitations of the sputtering device, such as gas flow amount. In specific, the film formation was not performed when: the total pressure was 2.7 Pa and the oxygen partial pressure ratio was 100%; the total pressure was 4.8 Pa and the oxygen partial pressure ratio was 30%; the total pressure was 4.8 Pa and the oxygen partial pressure ratio was 70%; and the total pressure was 4.8 Pa and the oxygen partial pressure ratio was 100%.

Firstly, concerning the dependence of driving voltage on total pressure, when the oxygen partial pressure ratio was 50% and the input power was 500 W, a clear reduction in driving voltage was observed when the total pressure was higher than 2.7 Pa and lower than or equal to 4.8 Pa, as illustrated in FIG. 16A. In addition, as a result of a different experiment, it was found that this trend of reduction in driving voltage continues at least until the total pressure is lower than or equal to 7.0 Pa. Taking this into account, it is preferable that total pressure be set higher than 2.7 Pa and lower than or equal to 7.0 Pa.

Next, concerning the dependence of driving voltage on oxygen partial pressure ratio, when the total pressure was set to 2.7 Pa and the input power was set to 500 W, it was observed that driving voltage decreases as oxygen partial pressure ratio increases, at least when the oxygen partial pressure ratio was set higher than or equal to 50% and lower than or equal to 70%, as illustrated in FIG. 16B. However, as a result of a different experiment, it was found that when the oxygen partial pressure ratio exceeds this range, the driving voltage begins to increase adversely. Taking this into account, it is preferable that oxygen partial pressure ratio during the forming of the hole injection layer 3 be set higher than or equal to 50%, while setting an upper limit at approximately 70%.

Finally, concerning the dependence of driving voltage on input power, when total pressure was set to 4.8 Pa and oxygen partial pressure ratio was set to 50%, a rapid increase in driving voltage was observed when the input power exceeded 500 W, as illustrated in FIG. 16C. Taking this into account, it is preferable that input power be restricted to be lower than or equal to 500 W. Here, it should be noted that, when referring to the data of the devices No. 1 and 3 in Table 3, it could be seen that, even when the input power was set to 500 W, the driving voltage is increased when the total pressure was set lower than or equal to 2.7 Pa.

Figure 17:
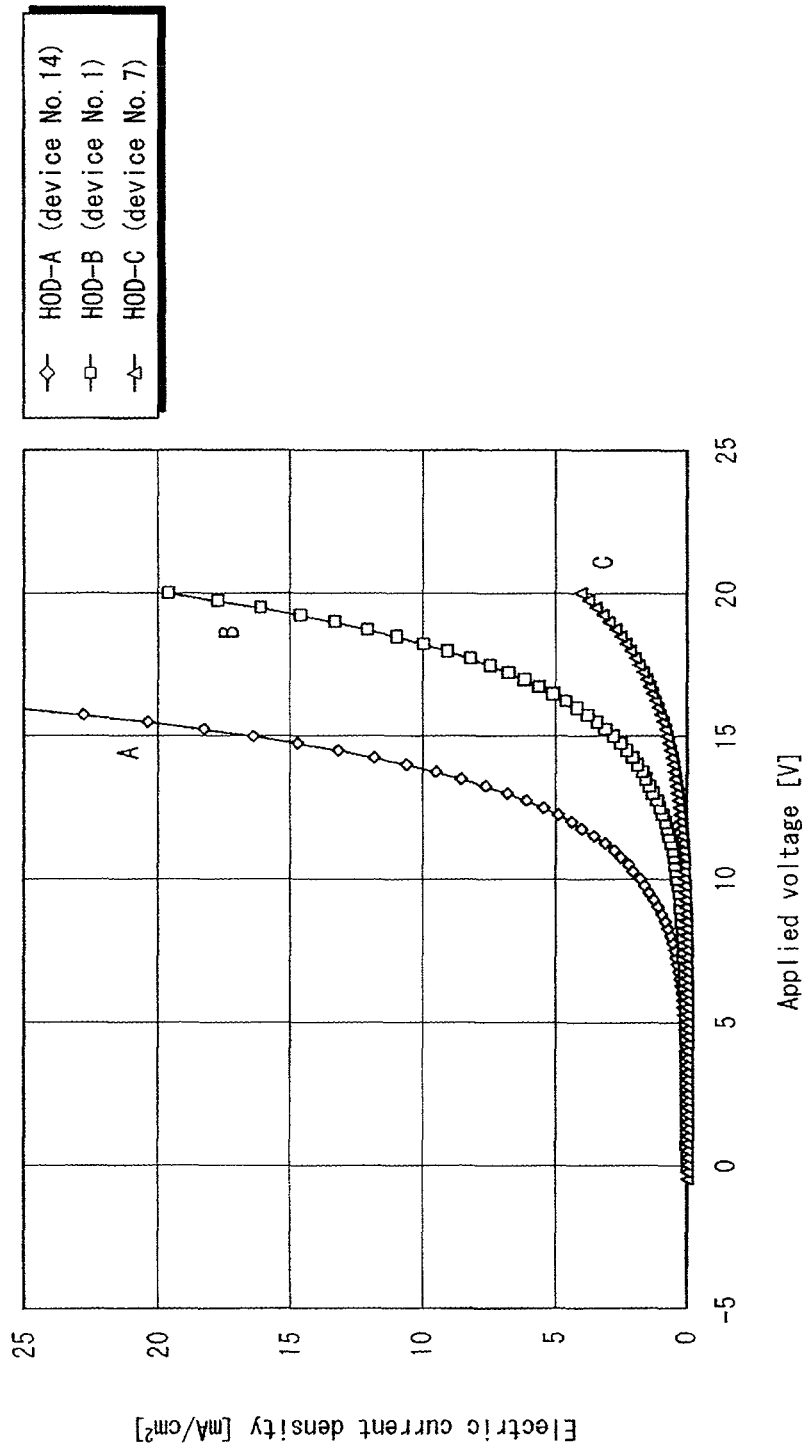
FIG. 17 is a device characteristics chart showing a curve representing a relationship between an applied voltage and a current density in a hole-only element.

Next, FIG. 17 illustrates an electric current density-voltage curve of the hole-only devices 201B, taking devices No. 14, 1, and 7 as examples. In the drawing, the vertical axis indicates electric current density (mA/cm$^2$), whereas the horizontal axis indicates applied voltage (V). Furthermore, device No. 14 fulfills all desirable film forming conditions explained in the above of total pressure, oxygen partial pressure, and input power, while on the other hand, each of devices No. 1 and 7 do not fulfill at least one of the desirable film forming conditions.

Concerning the film forming conditions under which the hole injection layer 203 (and the later-described tungsten oxide layer 208) is formed, in order as to facilitate the explanations to be provided in the following, hereinafter, the film forming conditions for device No. 14 is referred to as film forming conditions A, the film forming conditions for device No. 1 is referred to as film forming conditions B, and the film forming conditions for device No. 7 is referred to as film forming conditions C. In addition, devices No. 14, 1, and 7 are respectively illustrated as HOD-A, HOD-B, and HOD-C in FIG. 17 and Table 3.

As illustrated in FIG. 17, the electric current density-applied voltage curve indicating HOD-A indicates that HOD-A has a higher degree of responsiveness to an increase in applied voltage compared with HOD-B and HOD-C. Further, it could be seen that HOD-A requires for the lowest level of applied voltage to reach a high electric current density compared with HOD-B and HOD-C. From this, it is obvious that HOD-A has a higher degree of hole injection efficiency compared with HOD-B and HOD-C. Here, it should be noted that HOD-A operates at the lowest driving voltage among the hole-only devices 201B.

In the above, observation has been made of the hole injection efficiency of the hole injection layer 203 in each of the hole-only devices 201B. However, here it should be emphasized that the hole-only devices 201B and the display panel 10 illustrated in FIG. 8 have nearly the same structure, differing only in the cathode and the bank resin layer included. Therefore, the dependence of the hole injection efficiency from the hole injection layer 107 to the hole transport layer 110 on the film forming conditions is basically the display panel 10 and in the hole-only devices 201B. In order as to confirm the existence of such a similar dependence on the film forming conditions, the inventors prepared three separate organic EL devices 1, each having a hole injection layer 203 formed under a corresponding one of film forming conditions A, film forming conditions B, and film forming conditions C.

More specifically, the inventors prepared the organic EL devices by forming the 50 nm-thick anode 202 composed of an ITO thin film on the substrate 210, and further disposing, one the anode 202 so formed, the following layers in the order in which they are introduced: a 30 nm-thick hole injection layer 203 composed of tungsten oxide; a 20 nm-thick hole transport layer 204 composed of TFB, which is an organic amine-containing polymer; a 70 nm-thick light-emitting layer 205 composed of F8BT, which is an organic polymer; and the cathode 209 composed of a 5 nm-thick barium layer and a 100 nm-thick aluminum layer. Note that the assessment devices are different from the device illustrated in FIG. 15 in material of the cathode 209, and the banks were omitted from the structure thereof.

Figure 18:
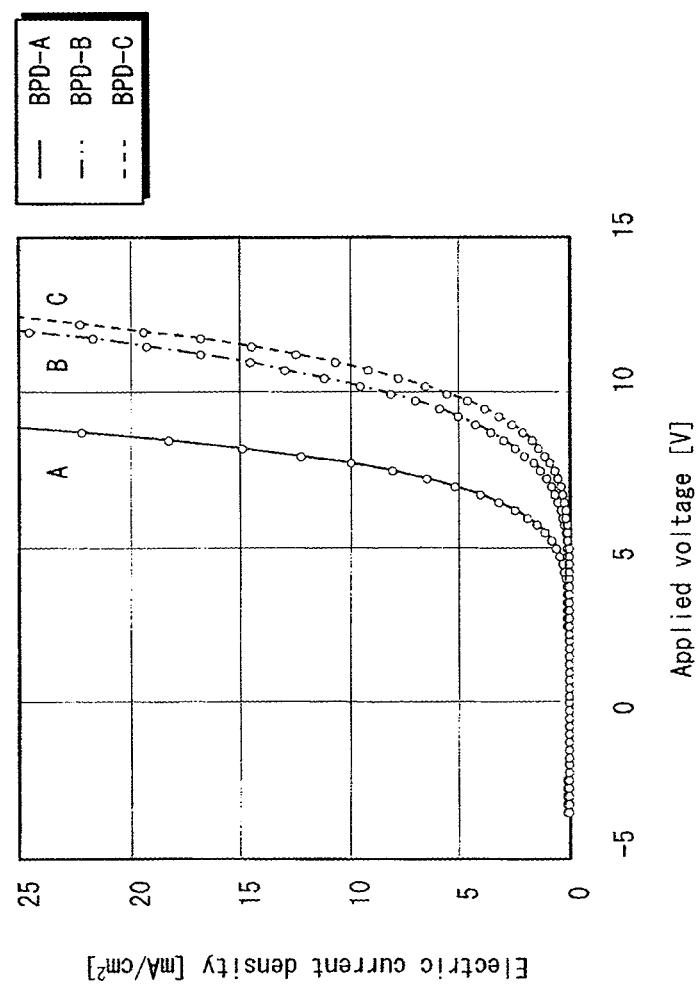
FIG. 18 is a device characteristics chart showing a curve representing a relationship between an applied voltage and a current density in a manufactured organic EL element.

The inventors connected each of the manufactured organic EL devices to a direct current power supply 211, and applied voltage thereto. FIG. 18 illustrates an electric current density-applied voltage curve indicating the relation between the electric current density value and the applied voltage. In the drawing, the vertical axis indicates electric current density (mA/cm$^2$), whereas the horizontal axis indicates applied voltage (V).

Note that, in order as to facilitate the explanations to be made in the following, the organic El devices prepared under film forming conditions A, B, and C are respectively illustrated as BPD-A, BPD-B, and BPD-C in FIG. 18.

As illustrated in FIG. 18, the electric current density-voltage curve indicating BPD-A indicates that BPD-A has a higher degree of responsiveness to an increase in applied voltage compared with BPD-B and BPD-C. Further, it could be seen that BPD-A requires for the lowest level of applied voltage to reach a high electric current density compared with BPD-B and BPD-C. This trend is similar to the trend which could be seen in the hole-only devices HOD-A, HOD-B, and HOD-C, which were prepared under the same respective film forming conditions as BPD-A, BPD-B, and BPD-C.

Figure 19:
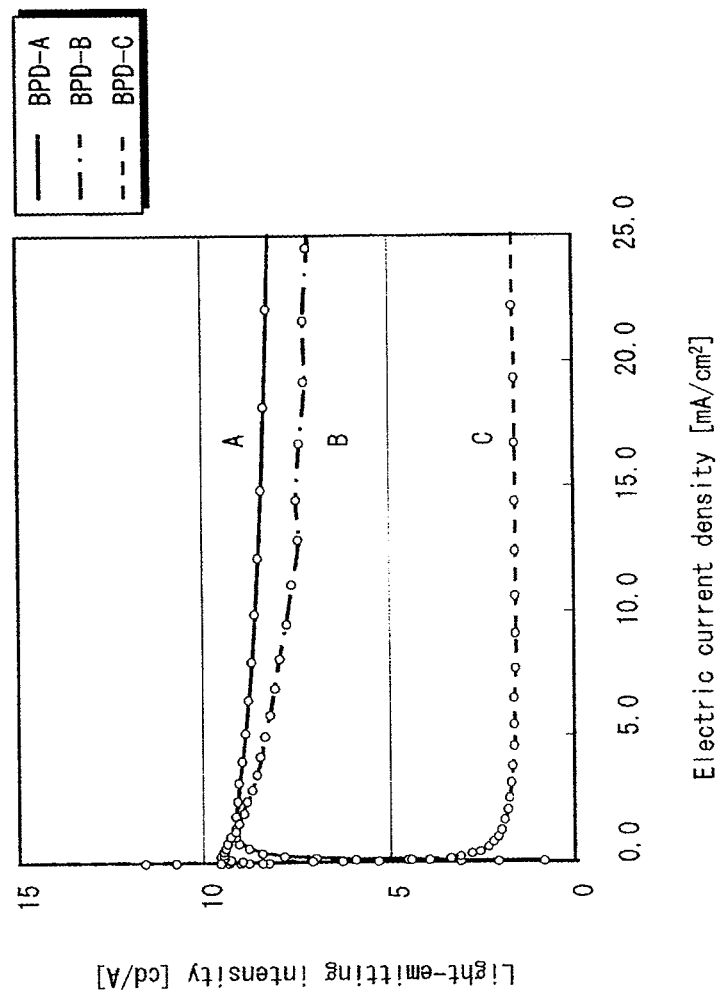
FIG. 19 is a device characteristics chart showing a curve representing a relationship between a current density and a luminous intensity in a manufactured organic EL element.

In addition, FIG. 19 illustrates light-emitting intensity-electric current density curves corresponding to the organic EL devices prepared in the above. Each light-emitting intensity-electric current density curve indicates the relation between the change in electric current density and the resultant change in luminous intensity of the corresponding organic EL device. In the drawing, the vertical axis indicates luminous intensity (cd/A), whereas the horizontal axis indicates electric current density (mA/cm$^2$). According to FIG. 19, it can be seen that BPD-A has the highest luminous intensity, at least within the range of electric current density that was measured in the experiment.

From the above results, it was confirmed that, concerning the organic EL devices, the hole injection efficiency of the hole injection layer 107 depends on the film forming conditions, similar as in the case of the hole-only devices 201B. That is, in the organic EL device under the test, when forming the tungsten oxide film composing the hole injection layer 203 by using metal tungsten as the sputtering target in a DC magnetron sputtering device by applying the reactive sputtering method while no control is performed with respect to substrate temperature and the chamber gas used is composed of argon gas and oxygen gas, a hole injection layer 203 having high hole injection efficiency with respect to the hole transport layer 204 was produced under film forming conditions where: (i) total pressure is higher than 2.7 Pa and lower than or equal to 7.0 Pa; (ii) oxygen partial pressure ratio is higher than or equal to 50% and lower than or equal to 70%; and (iii) input power density is higher than or equal to 1 W/cm$^2$ and lower than or equal to 2.8 W/cm$^2$. Thus, it was confirmed that a hole injection layer 203 formed while fulfilling such exemplary film forming conditions (i), (ii), and (iii) achieves both low voltage drive and high luminous efficiency.

Note that in the above, the condition concerning input power is indicated in terms of input power density by referring to Table 2. In addition, when using a DC magnetron sputtering device that is different from the DC magnetron sputtering device used in the present experiment, a hole injection layer 203 composed of tungsten oxide having a high hole injection efficiency can be similarly yielded by adjusting input power according to the size of the sputtering target. Note that the total pressure and oxygen partial pressure do not depend on the device to be used and the size of the sputtering target.

Additionally, as already explained in the above, no intentional adjustment of the substrate temperature was performed while forming the hole injection layer 203 by applying the reactive sputtering method. And during the experiment, the sputtering device was placed under room temperature. Therefore, the substrate was at room temperature at least before the forming of the hole injection layer 203 was performed. However, while forming of the hole injection layer 203 is being performed, there is a possibility that the substrate temperature may rise by several tens of degrees Celsius.

Furthermore, the organic EL device having the hole injection layer 203 formed under film forming conditions A corresponds to the organic EL device of the display panel 10 pertaining to the present Embodiment, which has the occupied energy level near the Fermi surface. Detailed observation is to be made regarding this point in the following.

(ii) Electronic State of Hole injection layer

The tungsten oxide composing the hole injection layer 107 of the organic EL device in the display panel 10 pertaining to the embodiment has the occupied energy level near the Fermi surface. The occupied energy level near the Fermi surface is formed by adjusting the film forming conditions under which the hole injection layer 203 is formed as description has been provided in the above. Details concerning this point are provided in the following.

The inventors conducted an experiment to determine whether the occupied energy level near the Fermi surface exists in each of the tungsten oxide films formed under a corresponding one of film forming conditions A, B, and C.

Figure 20:
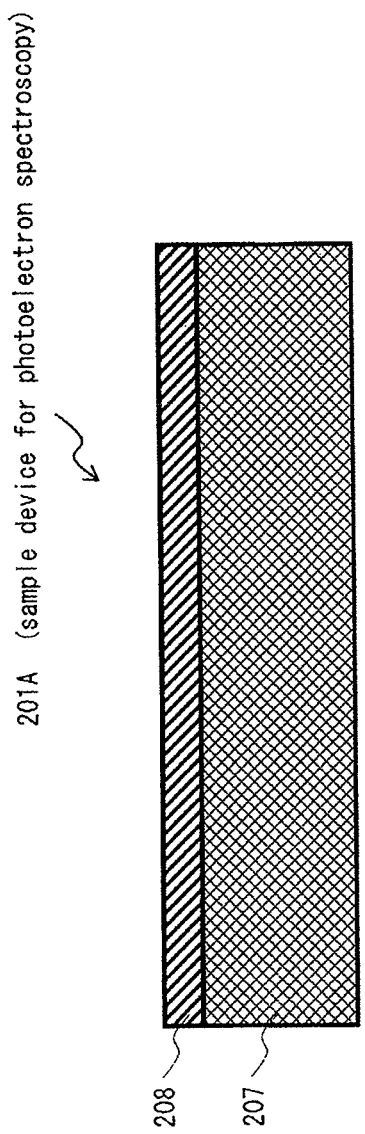
FIG. 20 is a schematic cross-sectional view showing the structure of a sample for photoelectron spectroscopic measurement.

The inventors prepared sample devices to be subjected to photoelectron spectroscopy measurement. Each of the sample devices was prepared under a corresponding one of the film forming conditions A, B, and C. In detail, each of the sample devices was prepared by forming a 10 nm-thick tungsten oxide layer 208 (corresponding to the hole injection layer 107) on a conductive silicon substrate 207 by applying the reactive sputtering method as described in the above. 201A in FIG. 20 indicates a sample device having such a structure. In the following description, a sample device 201A formed under film forming conditions A is referred to as sample device A, a sample device 201A formed under film forming conditions B is referred to as sample device B, and a sample device 201A formed under film forming conditions C is referred to as sample device C.

The forming of the tungsten oxide layer 208 of each of the sample devices was performed inside a sputtering device. Then, to prevent atmospheric exposure, the sample devices A, B, and C were transported to a glovebox which was connected to the sputtering device and which was filled with nitrogen gas. Subsequently, the sample devices were sealed inside transfer vessels in the glovebox, and were mounted on a photoelectron spectroscopy device. Thus, ultraviolet photoelectron spectroscopy (UPS) measurement of the sample devices was performed while preventing the tungsten oxide layer 208 having been formed on the sample devices from undergoing atmospheric exposure.

In general, a UPS spectrum obtained as a result of the UPS measurement reflects a state of occupied energy levels, such as a valence band and the like, within several nanometers in distance from the surface of the target of measurement. As such, the present experiment was conducted in order as to observe the state of occupied energy levels at a surface portion of the tungsten oxide layer 8 by utilizing UPS measurement.

The conditions under which the UPS measurement was conducted are as follows. Here, it should be noted that, since the sample devices A, B, and C commonly include the conductive silicon substrate 207, charge-up did not occur during the UPS measurement. Further, the interval between measurement points was set to 0.05 eV.

Light source: He I line

Bias: None

Electron emission angle: Normal line direction of the substrate surface

Figure 21:
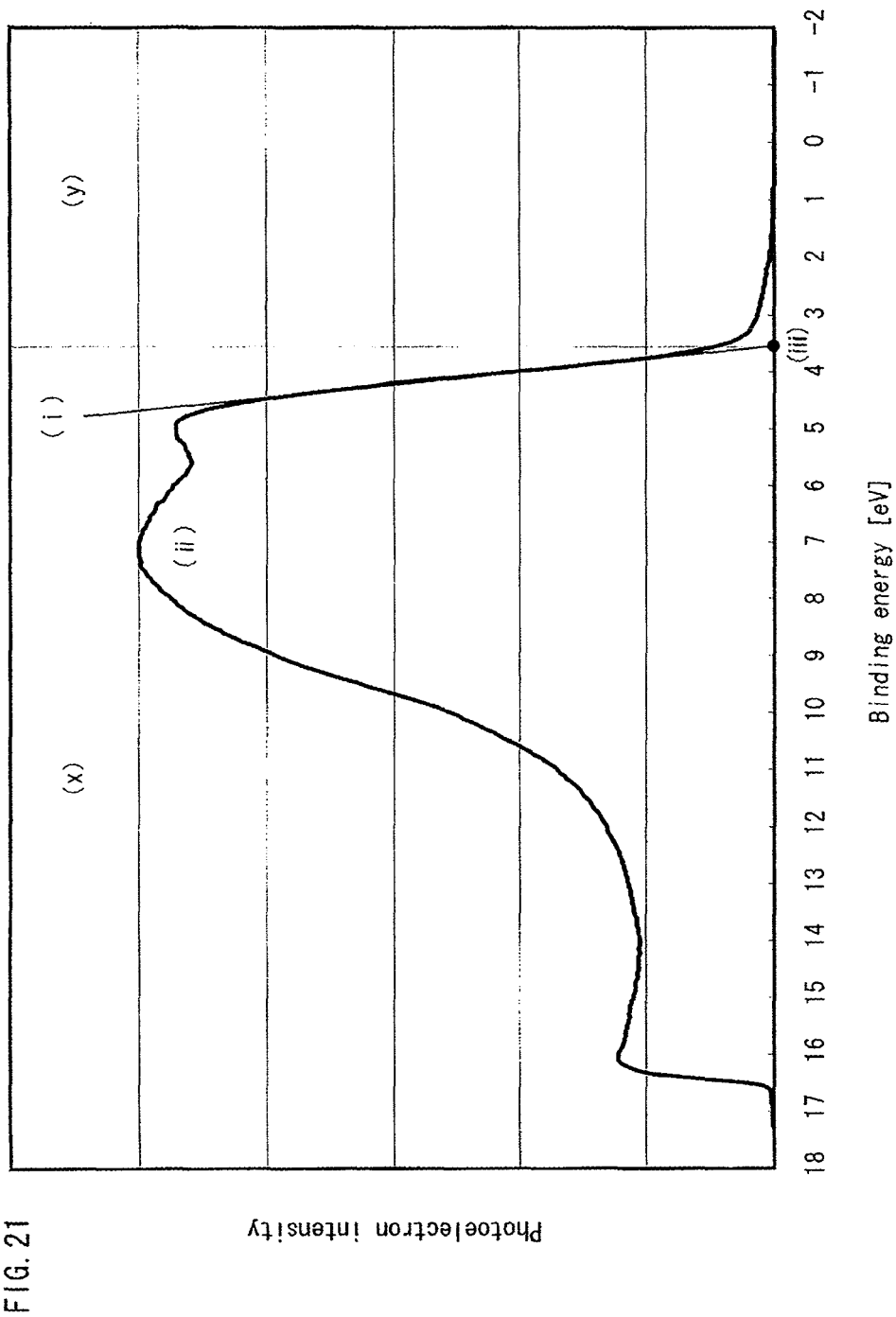
FIG. 21 shows a UPS spectrum of a tungsten oxide.

FIG. 21 illustrates a UPS spectrum of the tungsten oxide layer 208 of the sample device A. In FIG. 21, the horizontal axis indicates binding energy. The reference point on the horizontal axis corresponds to the Fermi surface of the conductive silicon substrate 207, and the left direction with respect to the reference point is positive, and the right direction with respect to the reference point is negative.

In the following, description is provided on each of the occupied energy levels of the tungsten oxide layer 208 with reference to FIG. 21.

Commonly, a UPS spectrum of tungsten oxide indicates a distinct, rapid rise which can be uniquely distinguished from other areas thereof. Here, a tangential line passing through an inflection point of the above rise is referred to as line (i), and the point at which line (i) intersects the horizontal axis is referred to as point (iii). The UPS spectrum of tungsten oxide can be divided into two areas: area (x) that extends in the high binding energy direction departing from point (iii); and area (y) that extends in the low binding energy direction (that is, to the direction of the Fermi surface) departing from point (iii).

Here, according to Table 4, each of the sample devices A, B, and C has a tungsten oxide layer 208 whose composition ratio between tungsten atoms and oxygen atoms is approximately 1:3. The composition ratios illustrated in Table 4 were obtained by performing X-ray photoelectron spectroscopy (XPS) measurement with respect to each of the sample devices A, B, and C. More specifically, XPS measurement of the sample devices was performed by using the photoelectron spectroscopy device while preventing atmospheric exposure of the tungsten oxide layer 208 having been formed on the sample devices, in a similar way as in the conduction of the UPS measurement. By conducting the XPS measurement, the conduction ratio between tungsten and oxygen within several nanometers in distance from the surface of the tungsten oxide layer 208 was estimated for each of the sample devices A, B, and C. Note that the film forming conditions under which the tungsten oxide layer 208 in each of the corresponding sample devices were formed are also illustrated in Table 4.

TABLE 4

| | Sample Device | | |
|---|---|---|---|
| | Sample Device A | Sample Device B | Sample Device C |
| Film Forming Conditions | Film Forming Conditions A | Film Forming Conditions B | Film Forming Conditions C |
| Total Pressure (Pa) | 4.8 | 2.7 | 2.7 |
| Oxygen Partial Pressure (%) | 50 | 70 | 70 |
| Input Power (W) | 250 | 500 | 1000 |
| Composition Ratio (Oxygen/Tungsten) | 3.0 | 2.9 | 2.8 |

According to the composition ratios obtained as a result of the XPS measurement, it could be assumed that in each of the sample devices A, B, and C, the tungsten oxide layer 208, at least within several nanometers in distance from the surface thereof, has a basic atomic arrangement which is in accordance with the atomic arrangement of tungsten trioxide. That is, the basic structure of the tungsten oxide layer 208 is assumed as being a distorted rutile structure (a structure where octahedrons share oxygen atoms at corners thereof with adjacent octahedrons) where oxygen atoms are bound to a tungsten atom to form an octahedral coordination. Taking this into account, the area (x) in FIG. 21 indicates an occupied energy level deriving from the basic structure as mentioned in the above, which is the structure of the crystalline phase of tungsten trioxide or of a non-crystalline phase of tungsten oxide, which lacks the order characteristic of the crystalline phase (note that the bond between atoms is maintained in the non-crystalline phase, and therefore the above-mentioned basic structure is preserved). Thus, the area (x) corresponds to a so-called valence band of the tungsten oxide layer 208. Note that the inventors of the present invention have performed X-ray absorption fine structure (XAFS) measurement with respect to the tungsten oxide layer 208 of each of the sample devices A, B, and C, and have confirmed that the above-mentioned basic structure is formed therein.

Accordingly, the area (y) in FIG. 21 corresponds to the band gap between the valence band and the conductive band of the tungsten oxide layer 208. Further, it is commonly known that an occupied energy level that differs from the occupied energy level of the valence band may exist in the area (y), as is suggested by the UPS spectrum in FIG. 21. This occupied energy level derives from another structure that is different from the above-mentioned basic structure, and is referred to as a so-called band gap (in-gap state or gap state) energy level.

Figure 22:
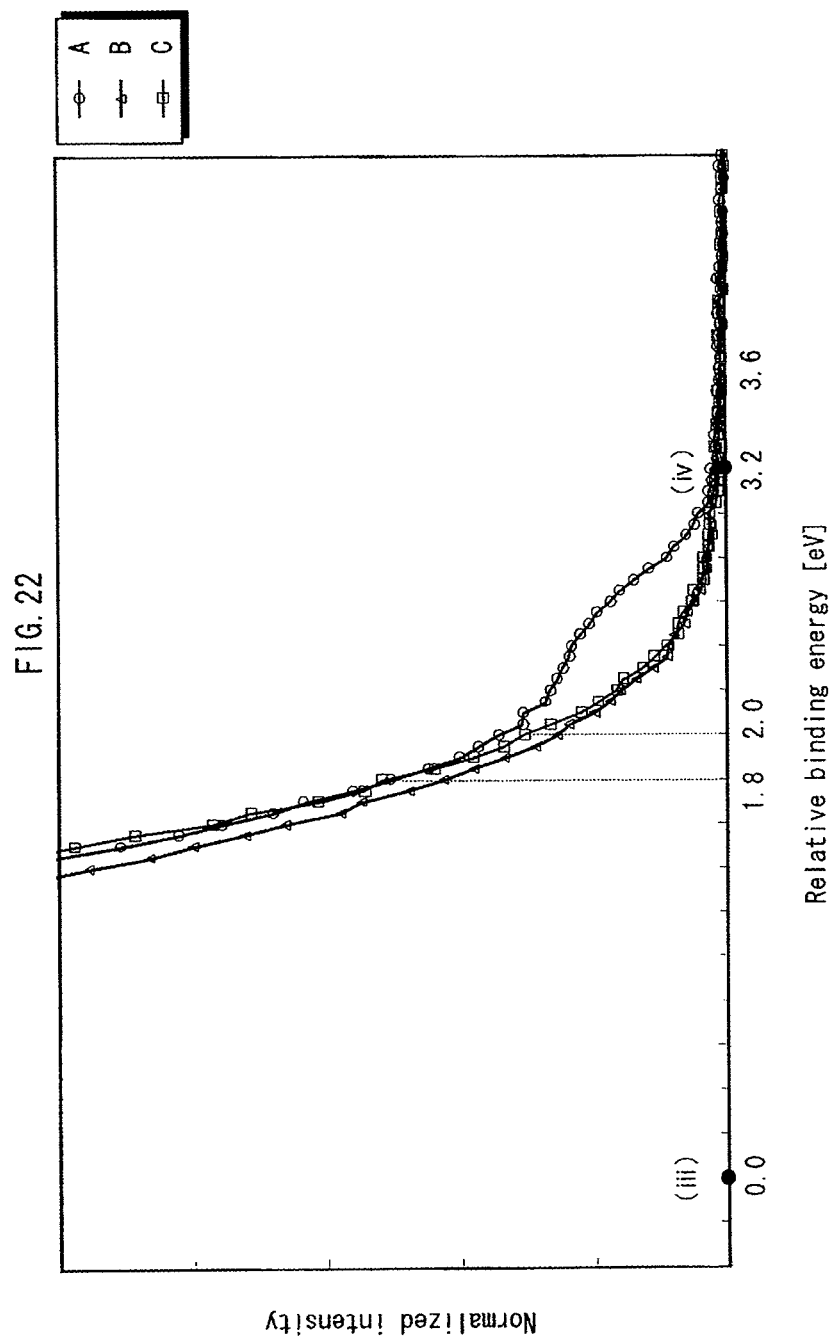
FIG. 22 shows a UPS spectrum of a tungsten oxide.

Next, FIG. 22 illustrates a UPS spectrum of the tungsten oxide layer 208 of each of the sample devices A, B, and C, particularly within area (x) in FIG. 22. The spectrum intensity indicated by the vertical axis in FIG. 22 has been normalized using the peak-top intensity value of a peak (ii) in FIG. 21, which is located approximately 3 eV to 4 eV to the high binding energy direction from point (iii). In addition, note that point (iii) in FIG. 22 is illustrated at the same point on the horizontal axis as in FIG. 21. The horizontal axis indicates a relative value (relative binding energy) with respect to point (iii), and the binding energy decreases as the relative binding energy increases. That is, a point that is further to the right of point (iii) (or closer to the side of the Fermi surface) has a lower binding energy compared to a point which is closer to point (iii).

As illustrated in FIG. 22, the spectrum indicating the tungsten oxide layer 208 of the sample device A exhibits a peak in an area between a point which is 3.6 eV lower in terms of binding energy than point (iii) and a point which is 1.8 eV lower in terms of binding energy than point (iii). Point (iv) in FIG. 22 indicates a point at which such a peak in the spectrum indicating the tungsten oxide layer 208 of the sample device A is first obviously observed. That is, point (iv) is a point at which the peak begins. The existence of such a peak is not observed in the spectra corresponding to sample devices B and C.

The present invention uses, for forming the hole injection layer, tungsten oxide whose UPS spectrum indicates an upward protrusion (not necessarily a peak) in an area which is 1.8 eV to 3.6 eV lower in terms of binding energy than point (iii). Hence, the organic EL device of the present invention exhibits excellent hole injection efficiency.

Furthermore, it has been found that hole injection efficiency is enhanced to a greater extent when the upward protrusion exhibited in the UPS spectrum has a higher degree of sharpness. Therefore, it can be said that the area of the UPS spectrum which is between a point 2.0 eV lower than point (iii) and another point 3.2 eV lower than point (iii), in terms of binding energy, is particularly essential, since the upward protrusion is more prominent and has a sharper inclination compared to other areas of the UPS spectrum.

Note that, in the following description, the upward protrusion as observed in the UPS spectrum is referred to as "a spectral protrusion near the Fermi surface". Furthermore, the energy level corresponding to this spectral protrusion near the Fermi surface is the "the occupied energy level near the Fermi surface", which has been already described in the above.

Subsequently, the inventors performed differentiation on the normalized intensity of the UPS spectrum of each of the sample devices A, B, and C indicated in FIG. 22. The differentiation was performed for the purpose of making the spectral protrusion near the Fermi surface more distinguishable.

In specific, by using the graph analysis software IGOR Pro 6.0, binomial smoothing (where smoothing factor was set to 1) was conducted eleven times with respect to the UPS spectra illustrated in FIG. 22, and differentiation was subsequently performed applying the central difference method. Such processing of data was conducted so as to remove fluctuation factors such as background noise generated during the UPS measurement, to smoothen the differential curves, and to convey the arguments presented in the following in a clear manner as possible.

Figure 23:
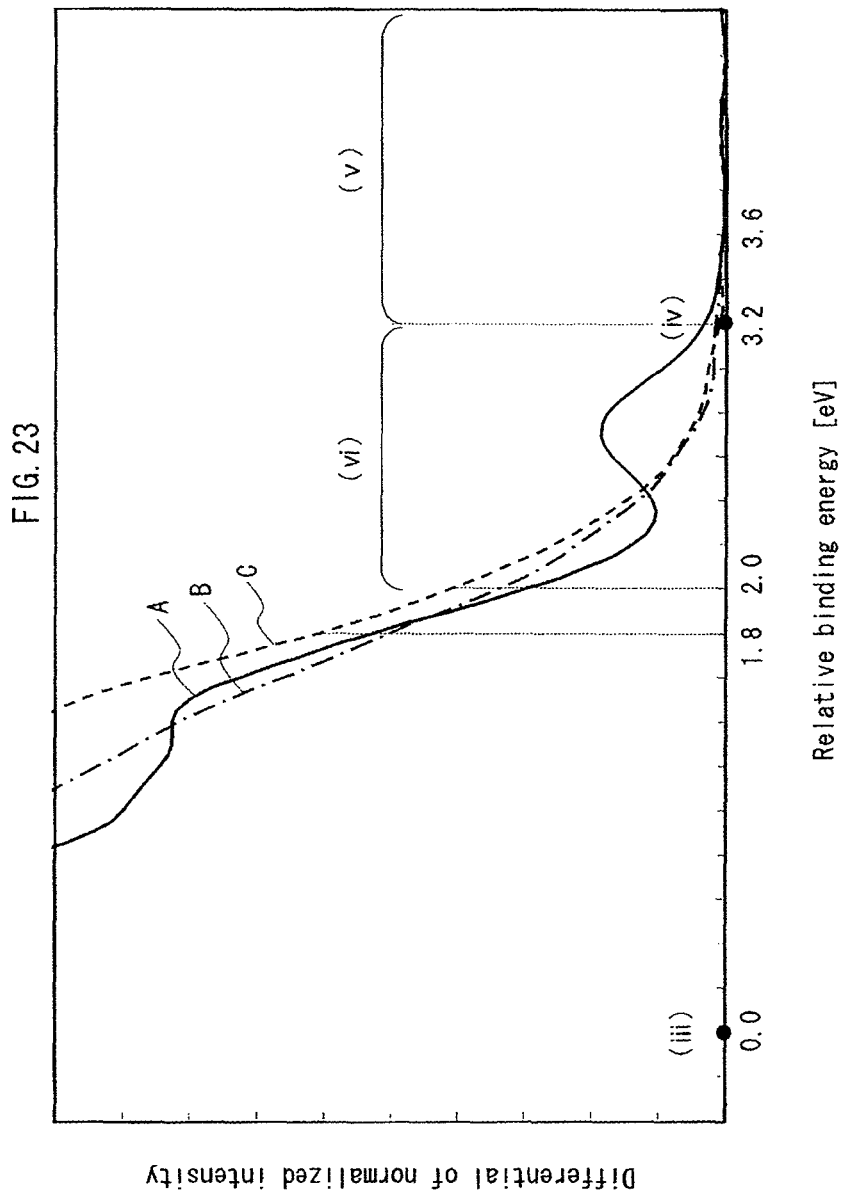
FIG. 23 shows a differential curve of the UPS spectrum shown in FIG. 22.

FIG. 23 illustrates differential curves yielded as a result of the above processing. Points (iii) and (iv) in FIG. 23 are provided at the same points on the horizontal axis as the respective points (iii) and (iv) in FIG. 22.

According to the differential curves illustrated in FIG. 23, the derivatives of normalized intensities of the tungsten oxide layers 208 corresponding to sample devices B and C do not depart from the vicinity of "0" within an area (v). Area (v) indicates an area which extends from a point which indicates a minimal binding energy that can be measured by using the photoelectron spectroscopy device to point (iv). Furthermore, in an area (vi) extending approximately 1.2 eV in the high binding energy direction from point (iv), the derivatives corresponding to sample devices B and C exhibit only a slight increase as approaching the high binding energy direction, although increase is seen in the increase rates thereof. In addition, the shapes of the differential curves corresponding to sample devices B and C within areas (v) and (vi) turn out to exhibit similarity with the respective UPS spectra illustrated in FIG. 22, from which the differential curves have been derived. Therefore, it can be said that the shapes of the UPS spectrum and the differential curve derived therefrom of each of sample devices B and C within areas (v) and (vi) resemble the shape of an exponential function curve.

Contrariwise, the differential curve corresponding to the tungsten oxide layer 208 of the sample device A exhibits a rapid rise from the vicinity of point (iv) towards the direction of point (iii). Thus, the shape of the differential curve corresponding to the tungsten oxide layer 208 of the sample device A within the areas (v) and (vi) clearly differs from the shape of an exponential function curve. Similarly, in FIG. 22, the spectrum corresponding to the tungsten oxide layer 208 of the sample device A, from which the differential curve in FIG. 23 corresponding to sample device A is derived, begins to protrude in the vicinity of point (iv). At the same time, it could also be seen that the spectrum in FIG. 22 exhibits a spectral protrusion near the Fermi surface, which is not found in a spectrum having the shape of an exponential function curve.

In other words, such a sample device A is characterized in that an occupied energy level near the Fermi surface is found in an area which is approximately 1.8 eV to 3.6 eV lower than the lowest energy level of a valence band of the hole injection layer, in terms of binding energy. More specifically, a spectral protrusion near the Fermi surface corresponding to the occupied energy level near the Fermi surface can be clearly seen in an area between a point which is approximately 2.0 eV lower than the lowest energy level of the valence band and another point which is approximately 3.2 eV lower than the lowest energy level of the valence band, in terms of binding energy, in the UPS spectrum corresponding to the sample device A.

Figure 24:
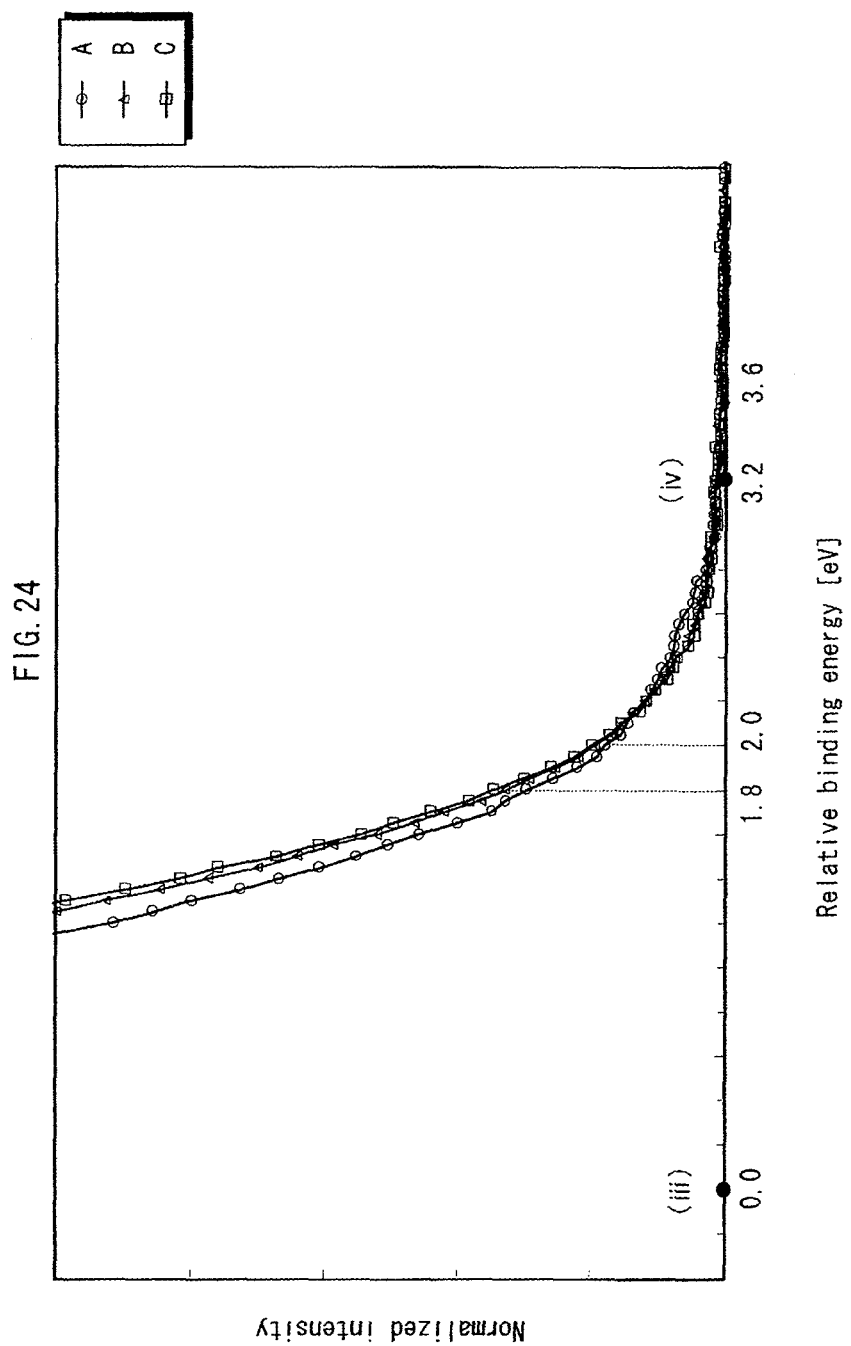
FIG. 24 shows a UPS spectrum of tungsten oxide exposed to atmosphere.

Next, the inventors conducted atmospheric exposure of the tungsten oxide layer 208 of each of the sample devices A, B, and C for a period of one hour. Note that the sample devices A, B, and C are the same sample devices as used in conducting the UPS measurement to obtain the UPS spectra in FIG. 22, and therefore have not been exposed to the atmosphere since the forming of the tungsten oxide layer 208. Following atmospheric exposure, the inventors conducted UPS measurement once again. Observation was conducted focusing on the changes in the UPS spectrum. FIG. 24 illustrates UPS spectra within the area (x). The horizontal axis in FIG. 23 is similar to the horizontal axis in FIG. 22, and points (iii) and (iv) in FIG. 23 are provided at the same points on the horizontal axis as the respective points (iii) and (iv) in FIG. 22.

According to the UPS spectra illustrated in FIG. 24, the tungsten oxide layer 208 of each of the sample devices B and C do not exhibit the spectral protrusion near the Fermi surface as with before atmospheric exposure. Contrariwise, it can be seen that the tungsten oxide layer 208 of the sample device A still exhibits the spectral protrusion near the Fermi surface even though the spectrum differs in intensity and shape when compared to before atmospheric exposure. Hence, it is observed that the tungsten oxide layer 208 of the sample device A maintains the same characteristics as before atmospheric exposure, even after conducting exposure thereof to the atmosphere for a certain period of time. Therefore, it can be concluded that the tungsten oxide layer 208 of the sample device A has a certain level of stability with respect to ambient atmosphere.

In the above, description has been provided regarding the sample devices A, B, and C with focus on the respective UPS spectra obtained as a result of UPS measurement. However, it should be noted that the existence of the spectral protrusion near the Fermi surface is to be similarly observed when applying an XPS measurement or a hard X-ray photoemission spectroscopy measurement.

Figure 25:
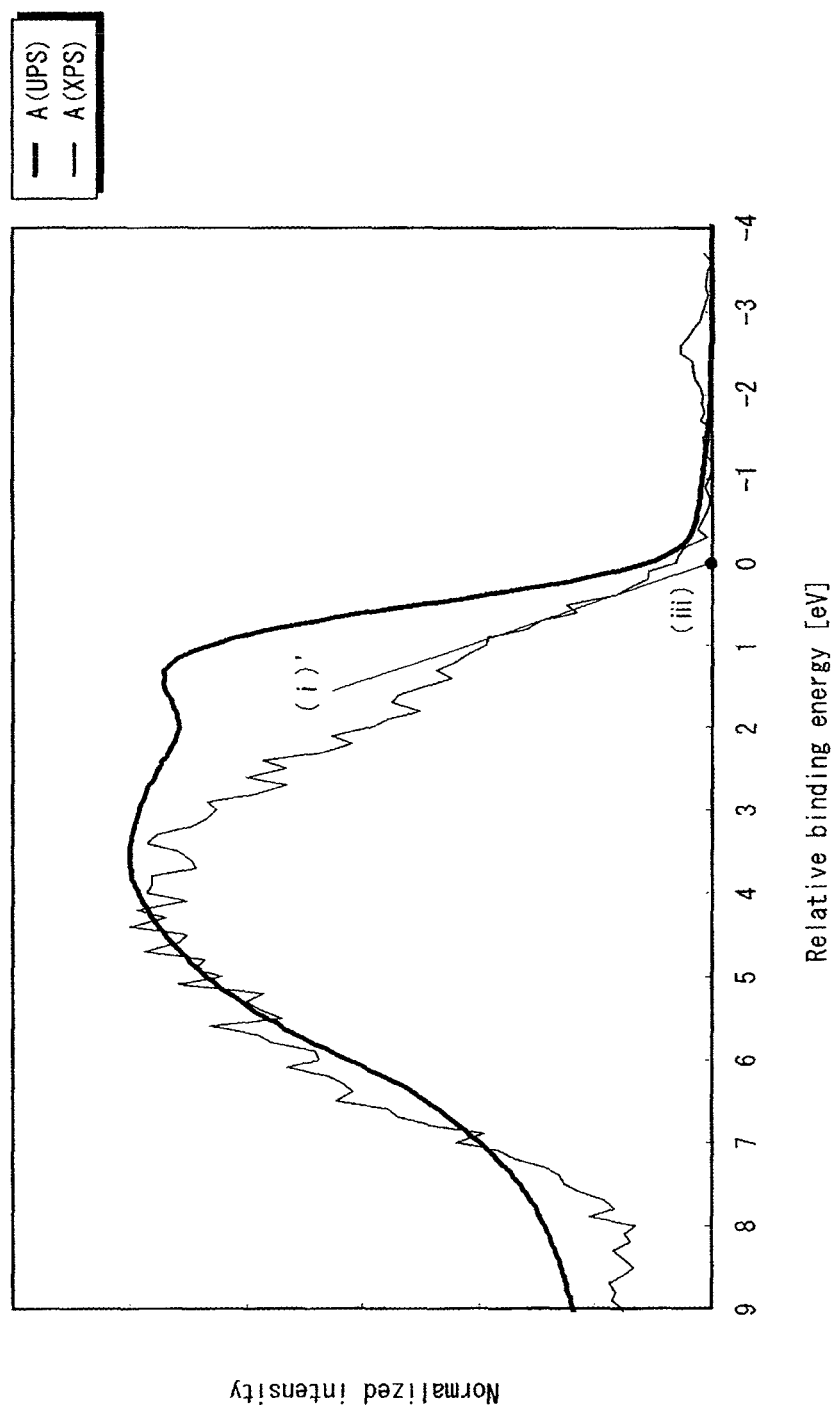
FIG. 25 shows UPS spectrum and XPS spectrum of tungsten oxide pertaining to the present invention together.

FIG. 25 illustrates an XPS spectrum of the tungsten oxide layer 208 of the sample device A after atmospheric exposure thereof. Note that, in FIG. 25, the XPS spectrum is overlaid with a UPS spectrum of the tungsten oxide layer 208 of the sample device A (the same UPS spectrum as illustrated in FIG. 21), so as to enable comparison between the two spectra.

The conditions under which the XPS measurement was conducted are similar to the conditions under which the UPS measurement was conducted as already described in the above, differing only in that an Al—K α line was used as the light source. In FIG. 25, point (iii) is provided at the same point on the horizontal axis as point (iii) in FIG. 21, and further, the horizontal axis indicates a relative binding energy with respect to point (iii) as in FIG. 22. In addition, a line in the XPS spectrum corresponding to the line (i) in FIG. 21 is illustrated as line (i)' in FIG. 25.

As illustrated in FIG. 25, the spectral protrusion near the Fermi surface of the tungsten oxide layer 208 of the sample device A is found in the XPS spectrum, as well as in the UPS spectrum. In detail, in the XPS spectrum of the tungsten oxide layer 208 of the sample device A, the spectral protrusion near the Fermi surface is exhibited as a protrusion of a considerable degree within an area between a point which is approximately 1.8 eV lower than the lowest energy level of a valence band of the hole injection layer and another point which is 3.6 eV lower than the lowest energy level of the valence band of the hole injection layer, in terms of binding energy. Further, the spectral protrusion near the Fermi surface was similarly found when a hard X-ray photoemission spectroscopy measurement was conducted.

In the above, the sample device 201A (illustrated in FIG. 20) was used, instead of the organic EL device which is illustrated in FIG. 15, as the sample device for conducting the photoelectron spectroscopy measurements. The sample device 201A has a structure which differs from the organic EL device, and is formed by disposing a tungsten oxide layer 208 on the conductive silicon substrate 207. Here, it should be noted that this measure has been taken merely for the sake of preventing the occurrence of charge-up, and thus, the structure of the organic EL device in the display panel pertaining to the present invention is not to be limited thereby.

According to another experiment conducted by the inventors of the present invention, when UPS measurement and XPS measurement were conducted against a sample device having the structure of the organic EL device in the display panel 10 as illustrated in FIG. 8 (the structure where the reflective anode 105, the transparent conductive film 106 and the hole injection layer 107 composed of tungsten oxide are formed in the stated order on one surface of the substrate 101), the occurrence of charge-up was encountered during the measurements.

However, by using a neutralizing electron gun in such measurements, the occurrence of charge-up can be inhibited. When the neutralizing electron gun was used, there were cases where the absolute value of the binding energy indicated by each of the occupied energy levels of the hole injection layer 107 (for instance, the binding energy value when the Fermi surface of the photoelectron spectroscopy device itself is determined as the reference point) differed from the corresponding value of the tungsten oxide layer 208 of the sample device 201A. However, a spectrum having a similar shape as the spectrum of the sample device 201A was obtained, at least within an area extending from the band gap energy level to the lowest energy level of the valence band, in terms of binding energy.

(iii) Analysis Concerning Hole Injection Efficiency

The principle of the effect that the existence of the occupied energy level near the Fermi surface in the hole injection layer composed of tungsten oxide has on hole injection efficiency can be explained as provided in the following. Note that the existence of the occupied energy level near the Fermi surface is to be observed as a spectral protrusion near the Fermi surface in, for instance, a UPS spectrum of the hole injection layer.

It has been frequently reported, with reference to results of experiments and first principles calculations, that existence of the occupied energy level near the Fermi surface, which can be seen in a thin film or a crystal of tungsten oxide, derives from oxygen vacancy or a structure similar thereto.

More specifically, assumption has been made that the existence of the occupied energy level near the Fermi surface derives from a binding orbital formed by 5d orbitals of adjacent tungsten atoms or from a 5d orbital of a singular tungsten atom which is not terminated with an oxygen atom and which exists at the surface of a film or within a film. Further, it is assumed that such 5d orbitals, when either in semi-occupied state or unoccupied state, are capable of pulling an electron off of the highest occupied molecular orbital of an organic molecule when contact is formed therebetween. The pulling of an electron from the organic molecule performed by the 5d orbital is believed to have the effect of stabilizing the energy state of both the tungsten atom and the organic molecule.

As a matter of fact, a report has been made that, when a layer composed of α-NPD, which is a small organic molecule, is layered on a thin film of molybdenum oxide, electrons transfer from the α-NPD molecule to the molybdenum oxide thin film (Hiromi Watanabe et al., Yuki EL Tohronkai Dai 7 Kai Reikai Yokoushuu, 17 (2008)). Here, explanation is provided concerning molybdenum oxide since molybdenum oxide has many common physical properties similar to those of tungsten oxide, such as a catalyst effect, electrochromism, and photochromism.

Further in detail, the inventors of the present invention have arrived at the conception that, in the case of tungsten oxide, a semi-occupied 5d orbital or a structure similar thereto of a single tungsten atom corresponds to the occupied energy level near the Fermi surface. The semi-occupied 5d orbital is lower in terms of binding energy than a binding orbital of 5d orbitals of adjacent tungsten atoms.

Figure 26:
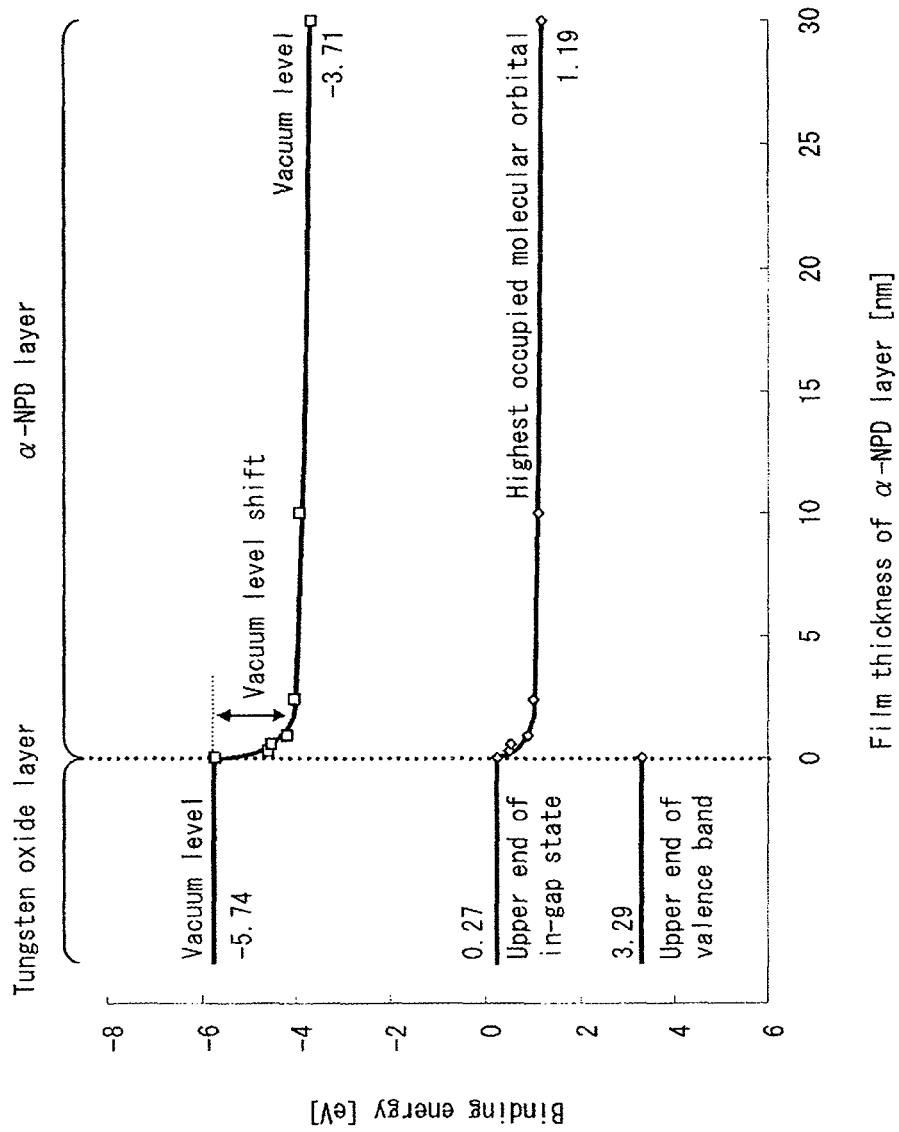
FIG. 26 is an interfacial energy diagram between tungsten oxide and α-NPD.

FIG. 26 is a diagram illustrating an energetic state at an interface between the tungsten oxide layer having the occupied energy level near the Fermi surface and an α-NPD layer.

FIG. 26 illustrates, with regards to the tungsten oxide layer (corresponding to the hole injection layer), the lowest binding energy of the valence band (illustrated as "upper end of the valence band" in the drawing) and the binding energy at the point at which the spectral rise near the Fermi surface begins (illustrated as "upper end of the in-gap state" in the drawing). Seen in relation to the UPS spectrum of the tungsten oxide layer, the upper end of the valence band corresponds to point (iii) in FIG. 21, and the upper end of the in-gap state corresponds to point (iv) in FIG. 22.

In addition, FIG. 26 illustrates a thickness of the α-NPD layer and a binding energy of the HOMO of the α-NPD, in a case where the α-NPD layer (corresponding to the functional layer) is disposed on the tungsten oxide layer. Furthermore, a vacuum level of each of tungsten oxide layer and the α-NPD layer is provided as well, in relation to the other energy levels illustrated. Here, the binding energy of the HOMO of the α-NPD layer corresponds to the binding energy at a point at which a peak of binding energy corresponding to the HOMO begins in the UPS spectrum of the α-NPD layer.

More specifically, the energy diagram illustrated in FIG. 26 is obtained through repeated alternate execution of the UPS measurement and the ultra high vacuum vapor deposition, where the tungsten oxide layer formed on the ITO substrate is transferred back and forth between a photoelectron spectroscopy device and a ultra high vacuum vapor deposition device connected to the photoelectron spectroscopy device. Since the occurrence of charge-up was not encountered during the UPS measurement, the binding energy on the vertical axis in FIG. 26 is indicated as an absolute value taken with respect to a reference point, which is the Fermi surface of the ITO substrate.

It could be seen in FIG. 26 that, at least within a 0-0.3 nm distance from the surface of the α-NPD layer facing the tungsten oxide layer, or that is, in a vicinity of the interface between the tungsten oxide layer and the α-NPD layer, the upper end of the in-gap state of the tungsten oxide layer and the HOMO of the α-NPD layer are substantially equivalent in terms of binding energy. Thus, a state can be seen where, so to speak, the energy levels of the tungsten oxide layer and the α-NPD layer are in alignment with each other (hereinafter, this state is referred to as an "interface energy level alignment"). Here, it should be noted that the state of "substantially equivalent" as referred to in the above actually includes a state where a slight difference exists between the binding energies of the two layers, and denotes a range of ±0.3 eV inclusive, to be specific.

Further, it can be seen from FIG. 26 that the interface energy level alignment is formed as a result of interaction between the tungsten oxide and the α-NPD, and not by mere coincidence. Refer to the following for reasons as to why such an indication can be made.

For instance, the change in vacuum level (vacuum level shift) observed at the interface between the tungsten oxide layer and the α-NPD layer indicates that an electrical double layer (EDL) is formed at the interface. Further, considering the direction in which the vacuum level shift is oriented, it can be seen that the EDL is formed to be negative in the direction of the tungsten oxide layer, and positive in the direction of the α-NPD layer. In addition, since the magnitude of the vacuum level shift is considerably large at around 2 eV, it could be reasonably assumed that the EDL has been formed as a result of some type of effect that is similar to a chemical bond. Thus, it can be reasonably assumed that the interface energy level alignment has been formed as a result of interaction between the tungsten oxide and the α-NPD.

Further, the inventors of the present invention assume that the interaction, in specific, is caused by a mechanism as described in the following.

The occupied energy level near the Fermi surface derives from the 5d orbital of a tungsten atom, as description has already been made in the above. In the following, the 5d orbital of the tungsten atom is referred to as a "W5d orbital corresponding to the spectral protrusion".

When the HOMO of an α-NPD molecule approaches the W5d orbital corresponding to the spectral protrusion at the surface of the tungsten oxide layer, an electron transfers from the HOMO of the α-NPD molecule to the W5d orbital corresponding to the spectral protrusion. Such transfer of an electron takes place since both the tungsten oxide layer and the α-NPD molecule seek for stabilization of energetic state. Hence, an EDL is formed at the interface between the tungsten oxide layer and the α-NPD layer, which brings about a vacuum level shift and an interface energy level alignment.

More specifically, many reports have been made, as a result of first principles calculations, that the HOMO of an α-NPD molecule is characterized in that: (i) the probability density thereof exhibits an uneven distribution of the HOMO near a nitrogen atom in an amine structure of the α-NPD molecule; and thus, (ii) the structure thereof includes, as the main composing element, a lone pair of electrons of a nitrogen atom. According to this, it could be assumed that, at the interface between the tungsten oxide layer and the layer of an organic amine-containing molecule, an electron transfers from the lone pair of electrons of the nitrogen atom in the amine structure of the amine-containing molecule, to the W5d orbital corresponding to the spectral protrusion.

The fact that there are reports made of interface energy level alignments, similar to the interface energy level alignment between the tungsten oxide layer and the α-NPD layer illustrated in FIG. 26, at interfaces formed between a vapor deposition film of molybdenum oxide and each of NPB, α-NPD, and F8BT supports this assumption (Refer to "Hyunbok Lee et al. Applied Physics Letters 93, 043308 (2008)", "Kenji Koizumi et al., Dai 56 Kai Ouyou Butsurigaku Kankei Rengou Kouenkai Yokoushuu, 30p-ZA-11 (2009)", "Yasuo Nakayama et al., Yuki EL Tohronkai Dai 7 Kai Reikai Yokoushuu, 5 (2008)", etc.). Note that molybdenum oxide has physical properties similar to tungsten oxide, as description has already made in the above, and further, NPB, α-NPD, and F8BT are commonly organic amine-containing molecules.

The excellent hole injection efficiency of the hole injection layer of the organic EL device pertaining to the present invention can be explained according to the interface energy level alignment as described in the above. That is, an interface energy level alignment occurs between the hole injection layer composed of tungsten oxide that has the occupied energy level near the Fermi surface and the adjacent functional layer. As a result, the binding energy at the point at which the spectral protrusion corresponding to the occupied energy level near the Fermi surface begins and the binding energy of the HOMO of the functional layer become substantially equivalent. The injection of holes takes place between such energy levels having the interface energy level alignment formed therebetween. Therefore, the hole injection barrier to be overcome when injecting holes to the HOMO of the functional layer is minimized to such an extent as could be ignored.

However, as description has been already provided in the above, the occupied energy level near the Fermi surface is formed by factors such as oxygen vacancy and structures similar thereto, and further, it is quite unlikely, in reality, that tungsten oxide exists that is completely free of all such factors. Hence, for instance, it can be reasonably assumed that, even in such tungsten oxide as used to prepare the above-mentioned sample devices B and C, which does not exhibit the spectral protrusion near the Fermi surface in the photoelectron spectroscopy spectrum, oxygen vacancy and structures similar thereto exist, however minimal they may be in terms of number.

In view of the above, hereinafter, explanation is provided, with reference to FIG. 27, of the reason for which the hole-only device HOD-A and the organic EL device BPD-A, both having the hole injection layer 203 which corresponds to the tungsten oxide layer 208 of the sample device A, exhibit excellent hole injection efficiency as observed through the above experiments.

To bring about the interaction between the HOMO of the organic molecule composing the functional layer and the occupied energy level near the Fermi surface of the tungsten oxide layer when disposing the tungsten oxide layer on the functional layer, the following condition needs to be fulfilled. That is, a portion of the organic molecule where the probability density of the HOMO is high, and an oxygen vacancy or a structure similar thereto of the tungsten oxide layer (illustrated as "injection site (x)" in the drawing) must approach each other to a distance at which the interaction is triggered (fall into contact with each other). The portion of the organic molecule where the probability density of the HOMO is high (illustrated as "injection site (y)" in the drawing) is, for instance, a nitrogen atom in the amine structure of an organic amine-containing molecule.

Figure 27A:
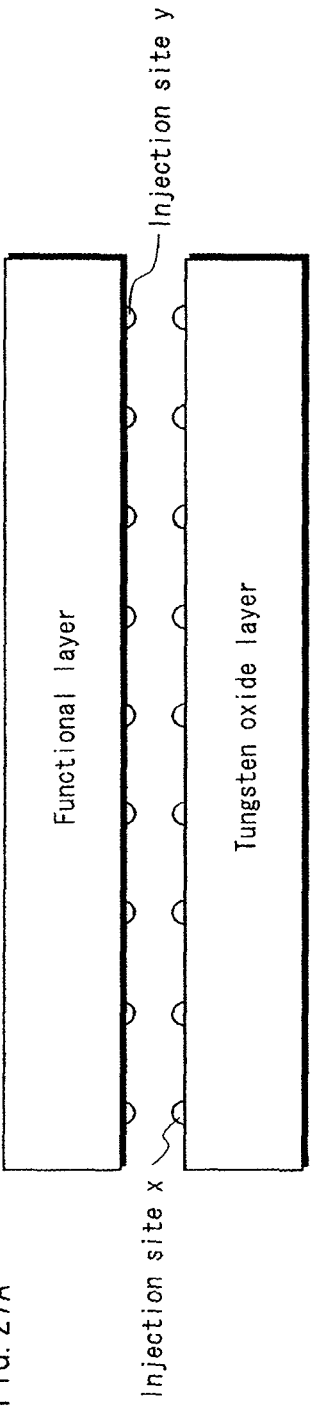
FIGS. 27A and 27B are diagrams illustrating an effect of an injection site of a hole injection layer and a functional layer.
Figure 27B:
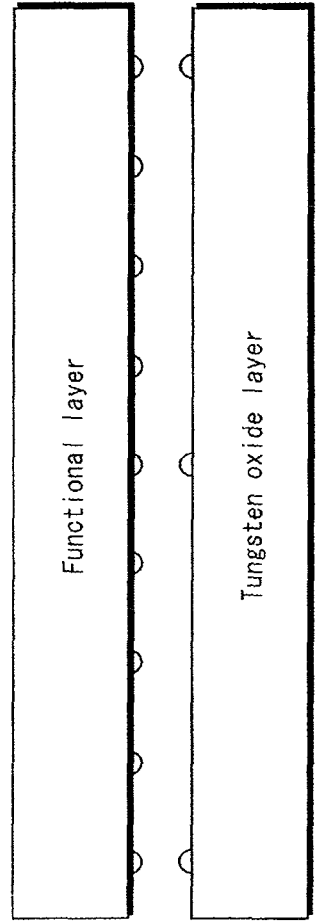

However, in a tungsten oxide layer as incorporated in the sample devices B and C, the number density of the injection site (x), if any, is extremely small, as illustrated in FIG. 27B. Accordingly, the upward protrusion near the Fermi surface does not appear in the UPS spectra thereof. Thus, the possibility of the injection site (x) and the injection site (y) falling into contact is extremely low. Since the injection of holes takes place where the injection site (x) and the injection site (y) fall into contact, it is clear that hole injection efficiency in sample devices B and C is extremely low.

In contrast to this, an abundance of injection sites (x) exists in the tungsten oxide layer which exhibits the spectral protrusion near the Fermi surface, as illustrated in FIG. 27A. Note that the tungsten oxide layer exhibiting the spectral protrusion near the Fermi surface is, for instance, the tungsten oxide layer incorporated in the above-mentioned sample device A. Thus, there is a high possibility of the injection sites (x) and the injection sites (y) falling into contact, and therefore the tungsten oxide layer exhibits excellent hole injection efficiency.

When summarizing the description provided in the above, the excellent hole injection efficiency of the organic EL device in the display panel pertaining to the present invention can be explained as follows.

Firstly, a hole injection layer composed of tungsten oxide exhibits, in the photoelectron spectroscopy spectrum thereof, an upward protrusion near the Fermi surface. Such a spectral protrusion near the Fermi surface is indicative of a considerable number of oxygen vacancies and structures similar thereto existing at the surface of the hole injection layer.

The occupied energy level near the Fermi surface, the existence of which is indicated by the spectral protrusion near the Fermi surface, pulls an electron off from the organic molecule composing the functional layer adjacent to the hole injection layer. As a result, the occupied energy level near the Fermi surface establishes an interface energy level alignment with the highest occupied molecular orbital (HOMO) of the organic molecule.

As such, if a considerable number of oxygen vacancies and structures similar thereto is found at the surface region of the hole injection layer, the possibility increases of the occupied energy level near the Fermi surface and a portion of the organic molecule having a high possibility density of the HOMO falling into contact with each other. Thus, the interface energy level alignment occurs efficiently, and accordingly, the tungsten oxide layer exhibits excellent hole injection efficiency.

Note that description of the bank resin layer inserted between the hole injection layer and the hole transport layer is omitted in the above.

[Embodiment 2]

Figure 28:
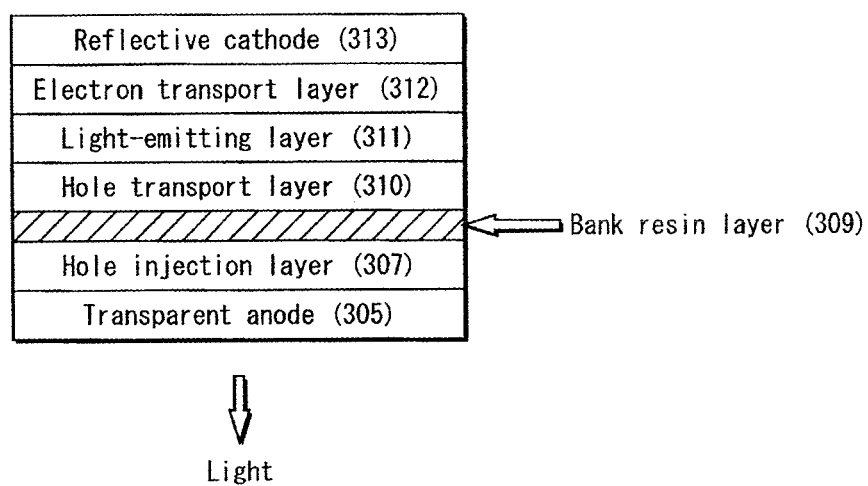
FIG. 28 is a schematic cross-sectional view showing part of a element structure in a display panel pertaining to Embodiment 2 of the present invention.

The following describes the structure of a display panel pertaining to Embodiment 2, with reference to FIG. 28. FIG. 28 schematically shows only characteristic portions of the display panel pertaining to this Embodiment. The other features are the same as Embodiment 1 described above.

A top-emission device is adopted in Embodiment 1 above as an example device, whereas a bottom-emission device is adopted in this Embodiment, as shown in FIG. 28.

As shown in FIG. 28, in the display panel pertaining to this Embodiment, the element structure includes a transparent anode 305, a hole injection layer 307, a bank resin layer 309, a hole transport layer 310, a light-emitting layer 311, an electron transport layer 312 and a reflective anode 313, which are layered from bottom top. The transparent anode 305 is composed of a transparent conductive film such as ITO and IZO, and the hole injection layer 307 is formed from tungsten oxide ($WO_X$) as with the hole injection layer 107 of Embodiment 1 above.

The bank resin layer 309 is formed by using the residual layer, and has a film thickness of equal to or less than 4 nm. The materials of the hole transport layer 310, the light-emitting layer 311 and the electron transport layer 312 are the same as Embodiment 1 above. The reflective cathode 313 is composed of aluminum (Al) or aluminum alloy, for example.

Also in the display panel pertaining to this Embodiment, the bank resin layer 309 is inserted between the hole injection layer 307 and the light-emitting layer 311, and the aging is performed under the same conditions, at the final stage of the manufacturing. Therefore, the display panel pertaining to this Embodiment achieves the same advantageous as described above.

Note that the manufacturing method is also the same as in Embodiment 1 above, except that several modifications may be made in view of the differences with respect to the materials of the layers.

[Embodiment 3]

In the display panel pertaining to Embodiment 3, a so-called line bank structure is adopted in a bank 408, as shown in FIG. 29. Specifically, as shown in FIG. 29, each bank 408 extends in the X axis direction, and light-emitting layers 411 of sub-pixels which are adjacent in the Y axis direction are partitioned by the banks 408.

The components other than the bank 408 are the same as Embodiments 1 or Embodiment 2 described above, and the bank resin layer formed by using the residual layer is inserted between the hole injection layer and the light-emitting layer. Furthermore, it is also the same that the aging is performed under the conditions described above, and therefore Embodiment 3 achieves the same advantageous effects.

[Embodiment 4]

Figure 30:
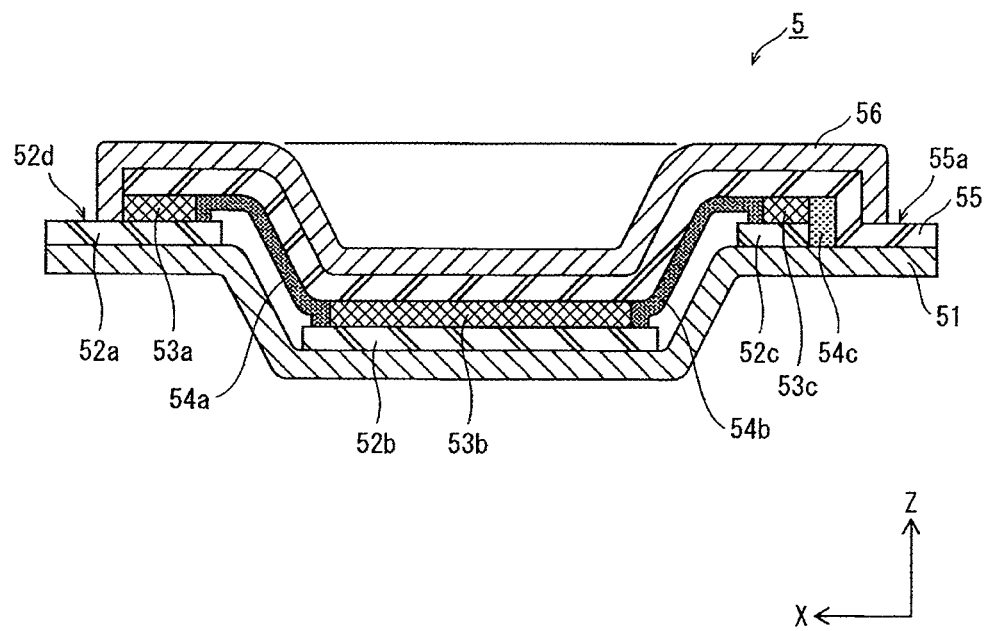
FIG. 30 is a schematic cross-sectional view showing the structure of a lighting device 5 pertaining to Embodiment 4 of the present invention.

The following describes the structure of a lighting device 5 pertaining to Embodiment 4, with reference to FIG. 30.

As shown in FIG. 30, the lighting device 5 includes transparent electrodes 52a, 52b and 52, a reflective electrode 55, and an organic EL layer members 53a, 53b and 53c inserted between the transparent electrodes 52a, 52b and 52c and the reflective electrode 55. The organic EL layer members 53a, 53b and 53c are housed in the space between a transparent substrate 51 and a sealing cover 56 of the lighting device 5. The transparent electrodes 52a, 52b and 52c are electrically connected to each other, and a portion 52d of the transparent electrode 52a protrudes outside the sealing cover 56.

A portion 55a of the reflective electrode 55 protrudes outside the sealing cover 56 from the side that is opposite to the side from which the transparent electrode 52a protrudes.

Each of the organic EL layer members 53a, 53b and 53c has the same structure as the element structure (organic EL layer member) inserted between the electrodes in the display panels 10 and so on pertaining to Embodiments 1-3 above. Note that the organic EL layer members 53a, 53b, 53c are connected by flexible insulators 54a and 54b inserted therebetween. The right end of the organic EL layer member 53c in the X axis direction is provided with an insulator 54c.

Although not depicted in detail in FIG. 30, the lighting device 5 pertaining to this Embodiment is the same in that the bank resin layer is inserted between the hole injection layer and the light-emitting layer of the organic EL layer members 53a, 53b and 53c. Furthermore, the organic EL layer members 53a, 53b and 53c of the lighting device 5 may be provided with banks for uniformity of the film thickness of the layers. In the present Embodiment, the bank resin layer is formed by using the residual layer generated in the bank formation, in the same manner as described above.

In the lighting device 5 pertaining to this Embodiment, a portion of light emitted from the organic EL layer members 53a, 53b and 53c travels downwards in the Z axis direction, passing through the transparent substrate 51, and the remaining portion travels upwards in the Z axis direction, is reflected by the reflective electrode 55, and is then emitted downwards in the Z axis direction. Furthermore, the lighting device 5 pertaining to Embodiment is the same in that the bank resin layer is inserted between the hole injection layer and the light-emitting layer of the organic EL layer members 53a, 53b and 53c, and the aging is performed in the final stage of the manufacturing. Hence, the lighting device 5 achieves the same advantageous effect of realizing a long lifetime as described above.

[Other Considerations]

In Embodiments 1-4 above, the reflective anode 55 and 105 and the reflective cathode 313 are formed by using aluminum (Al) or aluminum alloy (Al alloy). However, metal electrodes formed from other light-reflective metal may be adopted alternatively. For example, silver (Ag) or silver alloy (Ag alloy) may be used for forming reflective electrodes.

In Embodiments 1-4 above, a display device and a lighting device are described as examples. However, the present invention is applicable to other light-emitting devices, and even in such cases, the same advantageous effects can be produced. For example, the structure of the present invention may be adopted in signals.

In Embodiment 1 and so on, the bank resin layer 109 is formed over the whole surface of the hole injection layer 107, and the hole transport layer 110 as a portion of the functional layer is formed in contact with the bank resin layer 109. However, such a structure is not essential. Specifically, when "bank resin films" are formed separately on several areas on the surface of the hole injection layer, that is, when the bank resin films are not formed as a single complete layer, portions of the hole injection layer contact with the bank resin films, and other portions, where the bank resin films do not exist, contact with the surface of the hole transport layer.

INDUSTRIAL APPLICABILITY

The present invention is useful for realizing an organic light-emitting element, an organic light-emitting device, an organic display panel, and an organic display device that achieve high luminous efficiency regardless of the length of the driving time.

The invention claimed is:

1. A method of manufacturing an organic light-emitting element, comprising:
   forming a first layer above a substrate, the first layer having hole injection properties;
   forming a bank material layer above the first layer using a bank material;
   forming banks by patterning the bank material layer, and forming a resin film on a surface of the first layer by attaching a portion of the bank material layer to the first layer, the banks defining apertures corresponding to light-emitters;
   forming a functional layer by applying ink to the apertures, the ink contacting the resin film, the ink containing an organic material, the functional layer including an organic light-emitting layer;
   forming a second layer above the functional layer, the second layer having electron injection properties; and
   performing aging during a manufacturing process by degrading the hole injection properties of the first layer by applying electrical power to an element structure formed by forming the first layer, forming the bank material layer, forming the banks, forming the functional layer, and forming the second layer,
   wherein the resin film is formed in the apertures corresponding to light-emitters and between the first layer and the second layer.

2. The method of claim 1, wherein
   in forming the banks, the resin film is formed to have a thickness not exceeding approximately 4 nm.

3. The method of claim 1, wherein
   in degrading, power application to the element structure is performed so as to reduce a mobility of holes in the element structure to be not higher than 1/10 of the mobility before the power application.

4. The method of claim 1, wherein
   in degrading, power application to the element structure is performed for a period not exceeding approximately 30 minutes.

5. The method of claim 1, wherein
   forming the first layer includes:
   forming an anode above the substrate; and
   forming a hole injection layer above the anode using a tungsten oxide, and the first layer is formed to include the anode and the hole injection layer.

6. The method of claim 1, wherein
   in forming the banks by patterning, a portion of the first layer is dissolved in a developer used for patterning the bank material layer, so that a dent is formed in an area on a surface of the first layer facing the functional layer,
   the resin film being formed in the dent of the first layer.

7. The method of claim 5, wherein
   in forming the hole injection layer, a gas including argon gas and oxygen gas is used as a gas enclosed in a chamber of a sputtering device, and the hole injection layer using the tungsten oxide is formed under conditions where a total pressure of the gas in the chamber is from approximately 2.7 Pa to approximately 7.0 Pa, a partial pressure ratio of the oxygen gas is from approximately 50% to approximately 70% with respect to the total pressure of the gas in the chamber, and an input power density per unit surface area of a sputtering target is from approximately 1 W/cm$^2$ to approximately 2.8 W/cm$^2$.

8. The method of claim 1, wherein
   the bank material includes a photosensitive resin component and a fluorine component, and
   in forming the banks by patterning, the banks defining the apertures are formed by patterning the bank material layer by exposing a portion of the bank material layer and developing the portion using a developer.

9. The method of claim 1, wherein
   forming the second layer includes:
   forming an electron transport layer above the functional layer;
   forming a cathode above the electron transport layer; and
   forming a sealing layer above the cathode, and
   the second layer is formed to include the electron transport layer, the cathode, and the sealing layer.

10. The method of claim 1, wherein
    the resin film and the banks entirely coat an upper surface of the first layer, and
    the functional layer is formed to be in contact with the resin film.

11. An organic light-emitting device having an organic light-emitting element manufactured by a method according to claim 1.

12. An organic display panel having an organic light-emitting element manufactured by a method according to claim 1.

13. An organic display device having an organic light-emitting element manufactured by a method according to claim 1.

14. The method of claim 1, wherein
    the functional layer includes a hole transport layer below the organic light-emitting layer, and
    the resin film is formed between the first layer and the hole transport layer.

15. The method of claim 1, wherein
    an upper surface of the first layer includes a plurality of dents, the resin film being formed in the dents and having a thickness of at most 4 nm.

16. A method of manufacturing an organic light-emitting element, comprising:
    forming a first layer above a substrate, the first layer having hole injection properties;
    forming a bank material layer above the first layer using a bank material;
    forming banks by patterning the bank material layer, and forming a resin film on a surface of the first layer by attaching a portion of the bank material layer to the first layer, the banks defining apertures corresponding to light-emitters;
    forming a functional layer by applying ink to the apertures, the ink contacting the resin film, the ink containing an organic material, the functional layer including an organic light-emitting layer;
    forming a second layer above the functional layer, the second layer having electron injection properties; and
    degrading the hole injection properties of the first layer by applying electrical power to an element structure formed by forming the first layer, forming the bank material layer, forming the banks, forming the functional layer, and forming the second layer,
    wherein, in the degrading, power application to the element structure is performed so as to reduce a mobility of holes in the element structure to be not higher than 1/10 of the mobility before the power application.

17. The method of claim 16, wherein
the functional layer includes a hole transport layer below the organic light-emitting layer, and
the resin film is formed between the first layer and the hole transport layer.

18. The method of claim 16, wherein
an upper surface of the first layer includes a plurality of dents, the resin film being formed in the dents and having a thickness of at most 4 nm.

19. A method of manufacturing an organic light-emitting element, comprising:
forming a first layer above a substrate, the first layer having hole injection properties;
forming a bank material layer above the first layer using a bank material;
forming banks by patterning the bank material layer, and forming a resin film on a surface of the first layer by attaching a portion of the bank material layer to the first layer, the banks defining apertures corresponding to light-emitters;
forming a functional layer by applying ink to the apertures, the ink contacting the resin film, the ink containing an organic material, the functional layer including an organic light-emitting layer;
forming a second layer above the functional layer, the second layer having electron injection properties; and
degrading the hole injection properties of the first layer by applying electrical power to an element structure formed by forming the first layer, forming the bank material layer, forming the banks, forming the functional layer, and forming the second layer,
wherein forming the first layer includes:
forming an anode above the substrate; and
forming a hole injection layer above the anode using a tungsten oxide,
the first layer is formed to include the anode and the hole injection layer, and
in forming the hole injection layer, a gas including argon gas and oxygen gas is used as a gas enclosed in a chamber of a sputtering device, and the hole injection layer using the tungsten oxide is formed under conditions where a total pressure of the gas in the chamber is from approximately 2.7 Pa to approximately 7.0 Pa, a partial pressure ratio of the oxygen gas is from approximately 50% to approximately 70% with respect to the total pressure of the gas in the chamber, and an input power density per unit surface area of a sputtering target is from approximately 1 W/cm$^2$ to approximately 2.8 W/cm$^2$.

20. The method of claim 19, wherein
the functional layer includes a hole transport layer below the organic light-emitting layer, and
the resin film is formed between the first layer and the hole transport layer.

* * * * *